United States Patent
Aggarwal et al.

(10) Patent No.: US 12,494,403 B2
(45) Date of Patent: Dec. 9, 2025

(54) PRESERVING ACCESS TO OPTICAL COMPONENTS ON A WAFER PACKAGE WITH SACRIFICIAL DIE

(71) Applicant: Celestial AI Inc., Santa Clara, CA (US)

(72) Inventors: Ankur Aggarwal, Pleasanton, CA (US); Subal Sahni, La Jolla, CA (US); Anmol Rathi, San Jose, CA (US); Suresh Venkata Pothukuchi, Chandler, AZ (US)

(73) Assignee: Celestial AI Inc., Santa Clara, CA (US)

( * ) Notice: Subject to any disclaimer, the term of this patent is extended or adjusted under 35 U.S.C. 154(b) by 0 days.

(21) Appl. No.: 19/098,960

(22) Filed: Apr. 2, 2025

(65) Prior Publication Data

US 2025/0372470 A1    Dec. 4, 2025

Related U.S. Application Data

(60) Provisional application No. 63/694,684, filed on Sep. 13, 2024, provisional application No. 63/655,461, filed on Jun. 3, 2024.

(51) Int. Cl.
*G02B 6/42* (2006.01)
*H01L 23/31* (2006.01)
*H01L 25/16* (2023.01)

(52) U.S. Cl.
CPC .......... *H01L 23/315* (2013.01); *G02B 6/4228* (2013.01); *H01L 25/167* (2013.01)

(58) Field of Classification Search
CPC .... H01L 23/315; H01L 25/167; G02B 6/4228
See application file for complete search history.

(56) References Cited

U.S. PATENT DOCUMENTS

| | | |
|---|---|---|
| 7,778,501 B2 | 8/2010 | Beausoleil et al. |
| 7,889,996 B2 | 2/2011 | Zheng et al. |
| 7,961,990 B2 | 6/2011 | Krishnamoorthy et al. |
| 8,064,739 B2 | 11/2011 | Binkert et al. |
| 8,237,278 B2 | 8/2012 | Gluschenkov et al. |
| 9,495,295 B1 | 11/2016 | Dutt et al. |

(Continued)

FOREIGN PATENT DOCUMENTS

| | | |
|---|---|---|
| CN | 106980160 A | 7/2017 |
| WO | WO2023177417 | 9/2022 |

(Continued)

OTHER PUBLICATIONS

U.S. Appl. No. 17/807,692, filed Jun. 17, 2022, Winterbottom et al.

(Continued)

*Primary Examiner* — Uyen Chau N Le
*Assistant Examiner* — Hoang Q Tran
(74) *Attorney, Agent, or Firm* — Ray Quinney & Nebeker P.C.; James S. Bullough

(57) ABSTRACT

The present disclosure relates to packaging techniques in connection with packaging electrical and optical components within circuit packages. For example, one or more examples described herein involve techniques for packaging an electro-photonic circuit while preserving access to a grating coupler, which may involve using a sacrificial die in conjunction with a unique overmolding process.

22 Claims, 23 Drawing Sheets

(56) References Cited

U.S. PATENT DOCUMENTS

| | | |
|---|---|---|
| 9,791,761 B1 | 10/2017 | Li et al. |
| 9,831,360 B2 | 11/2017 | Knights et al. |
| 10,168,475 B2 | 1/2019 | Parker et al. |
| 10,852,492 B1 | 12/2020 | Vermeulen et al. |
| 10,962,728 B2 | 3/2021 | Nelson et al. |
| 10,976,491 B2 | 4/2021 | Coolbaugh et al. |
| 11,107,770 B1 | 8/2021 | Ramalingam et al. |
| 11,222,867 B1 | 1/2022 | Huang et al. |
| 11,233,580 B2 | 1/2022 | Meade et al. |
| 11,336,376 B1 | 5/2022 | Xie |
| 11,493,714 B1 | 11/2022 | Mendoza et al. |
| 11,500,153 B2 | 11/2022 | Meade et al. |
| 11,509,397 B2 | 11/2022 | Ma et al. |
| 11,817,903 B2 | 11/2023 | Pleros et al. |
| 11,837,509 B1 | 12/2023 | Chou et al. |
| 12,055,766 B2 | 8/2024 | Pupalaikis et al. |
| 12,148,742 B2 | 11/2024 | Liljeberg et al. |
| 12,191,257 B2 | 1/2025 | Aggarwal |
| 2011/0206379 A1 | 8/2011 | Budd |
| 2015/0354938 A1 | 12/2015 | Mower et al. |
| 2016/0116688 A1 | 4/2016 | Hochberg et al. |
| 2017/0045697 A1 | 2/2017 | Hochberg et al. |
| 2017/0115458 A1 | 4/2017 | Mekis et al. |
| 2017/0194309 A1 | 7/2017 | Evans et al. |
| 2017/0207600 A1 | 7/2017 | Klamkin et al. |
| 2017/0237226 A1 | 8/2017 | Johnson et al. |
| 2017/0261693 A1 | 9/2017 | Gambino et al. |
| 2017/0261708 A1 | 9/2017 | Ding et al. |
| 2019/0049665 A1 | 2/2019 | Ma et al. |
| 2019/0067037 A1 | 2/2019 | Pelletier et al. |
| 2019/0205737 A1 | 7/2019 | Bleiweiss et al. |
| 2019/0265408 A1 | 8/2019 | Ji et al. |
| 2019/0317285 A1 | 10/2019 | Liff |
| 2019/0317287 A1 | 10/2019 | Raghunathan et al. |
| 2020/0006304 A1 | 1/2020 | Chang et al. |
| 2020/0142441 A1 | 5/2020 | Bunandar et al. |
| 2020/0158967 A1 | 5/2020 | Winzer et al. |
| 2020/0200987 A1 | 6/2020 | Kim |
| 2020/0203309 A1* | 6/2020 | Beyne .................... H01L 24/81 |
| 2020/0250532 A1 | 8/2020 | Shen et al. |
| 2020/0284981 A1 | 9/2020 | Harris et al. |
| 2021/0064958 A1 | 3/2021 | Lin et al. |
| 2021/0132309 A1 | 5/2021 | Zhang et al. |
| 2021/0247569 A1 | 8/2021 | Traverso et al. |
| 2021/0257396 A1 | 8/2021 | Piggott et al. |
| 2021/0266200 A1 | 8/2021 | Yang |
| 2021/0271020 A1 | 9/2021 | Islam et al. |
| 2021/0286129 A1 | 9/2021 | Fini et al. |
| 2022/0091332 A1 | 3/2022 | Yoo et al. |
| 2022/0159860 A1 | 5/2022 | Winzer et al. |
| 2022/0171142 A1 | 6/2022 | Wright et al. |
| 2022/0328395 A1 | 10/2022 | Chen et al. |
| 2022/0342150 A1 | 10/2022 | Karhade et al. |
| 2022/0342164 A1 | 10/2022 | Chen et al. |
| 2022/0374575 A1 | 11/2022 | Ramey et al. |
| 2022/0382005 A1 | 12/2022 | Rusu |
| 2023/0088009 A1 | 3/2023 | Karhade et al. |
| 2023/0197699 A1 | 6/2023 | Spreitzer et al. |
| 2023/0258881 A1* | 8/2023 | Weng .................... G02B 6/43 |
| | | 257/432 |
| 2023/0258886 A1 | 8/2023 | Liao |
| 2023/0308188 A1 | 9/2023 | Dorta-Quinones |
| 2023/0314702 A1 | 10/2023 | Yu |
| 2023/0352464 A1 | 11/2023 | Damaraju et al. |
| 2023/0376818 A1 | 11/2023 | Nowak |
| 2023/0393357 A1 | 12/2023 | Ranno |
| 2023/0395443 A1 | 12/2023 | Lai et al. |
| 2024/0030065 A1 | 1/2024 | Duan et al. |
| 2024/0030147 A1 | 1/2024 | Duan et al. |
| 2024/0030204 A1 | 1/2024 | Duan et al. |
| 2024/0036254 A1 | 2/2024 | Winzer et al. |
| 2024/0097796 A1 | 3/2024 | Winzer et al. |
| 2024/0272385 A1 | 8/2024 | Chen et al. |
| 2025/0062258 A1 | 2/2025 | Kannan et al. |
| 2025/0167187 A1 | 5/2025 | Yu et al. |
| 2025/0201793 A1 | 6/2025 | Suthram et al. |
| 2025/0216629 A1 | 7/2025 | Psaila et al. |

FOREIGN PATENT DOCUMENTS

| | | |
|---|---|---|
| WO | WO2022266676 | 12/2022 |
| WO | WO2023177922 | 9/2023 |

OTHER PUBLICATIONS

U.S. Appl. No. 18/293,673, filed Oct. 17, 2024, Bos et al.

Agrawal, Govind; "Chapter 4—Optical Receivers", Fiber-Optic Communications Systems, John Wiley & Sons, Inc., (2002), pp. 133-182.

Eltes, Felix et al.; "A BaTiO3-Based Electro-Optic Pockets Modulator Monolithically Integrated on an Advanced Silicon Photonics Platform"; J. Lightwave Technol. vol. 37, No. 5; (2019), pp. 1456-1462.

Eltes, Felix et al.; Low-Loss BaTiO3-Si Waveguides for Nonlinear Integrated Photonics; ACS Photon., vol. 3, No. 9; (2016), pp. 1698-1703.

Harris, NC et al.; "Efficient, compact and low loss thermo-optic phase shifter in colicon"; Opt. Express, vol. 22, No. 9; (2014), pp. 10487-10493.

Hendry, G. et al.; "Circuit-Switched Memory Access in Photonic Interconnection Networks for High-Performance Embedded Computing," SC '10: Proceedings of the 2010 ACM/IEEE International Conference for High Performance Computing, Networking, Storage and Analysis, New Orleans, LA, USA, 2010, pp. 1-12.

Miller, David A. et al; "Self-Configuring Universal Linear Optical Component"; Photon. Res. 1; [Online]; Retrieved from the interent: URL: https://arxiv.org/ftp/arxiv/papers/1303/1303.4602.pdf; (2013), pp. 1-15.

Raj, Mayank et al.; "Design of a 50-Gb/s Hybid Integrated Si-Photonic Optical Link in 16-nm FinFET"; IEEE Journal of Solid-State Circuits, vol. 55, No. 4, Apr. 2020, pp. 1086-1095.

Zhang, Yulong; "Building blocks of a silicon photonic integrated wavelength division multiplexing transmitter for detector instrumentation", Doktors Der Ingenieurwissenschaften (Dr.-Ing. ), Dec. 15, 2020 (Dec. 15, 2020), 128 pages.

"International Search Report and Written Opinion issued in PCT Application No. PCT/US2025/031959", Mail Date: Sep. 16, 2026, 17 pages.

* cited by examiner

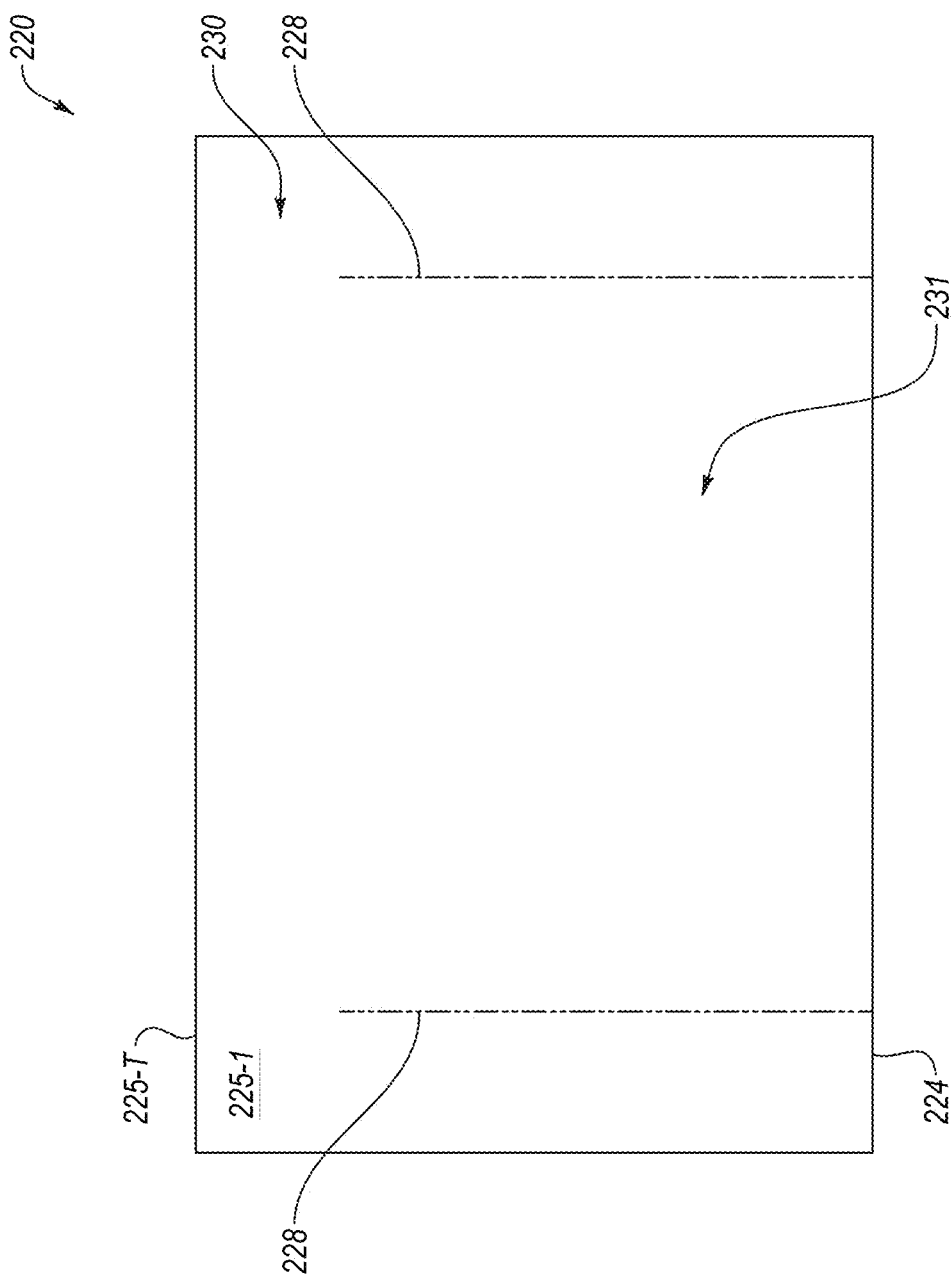

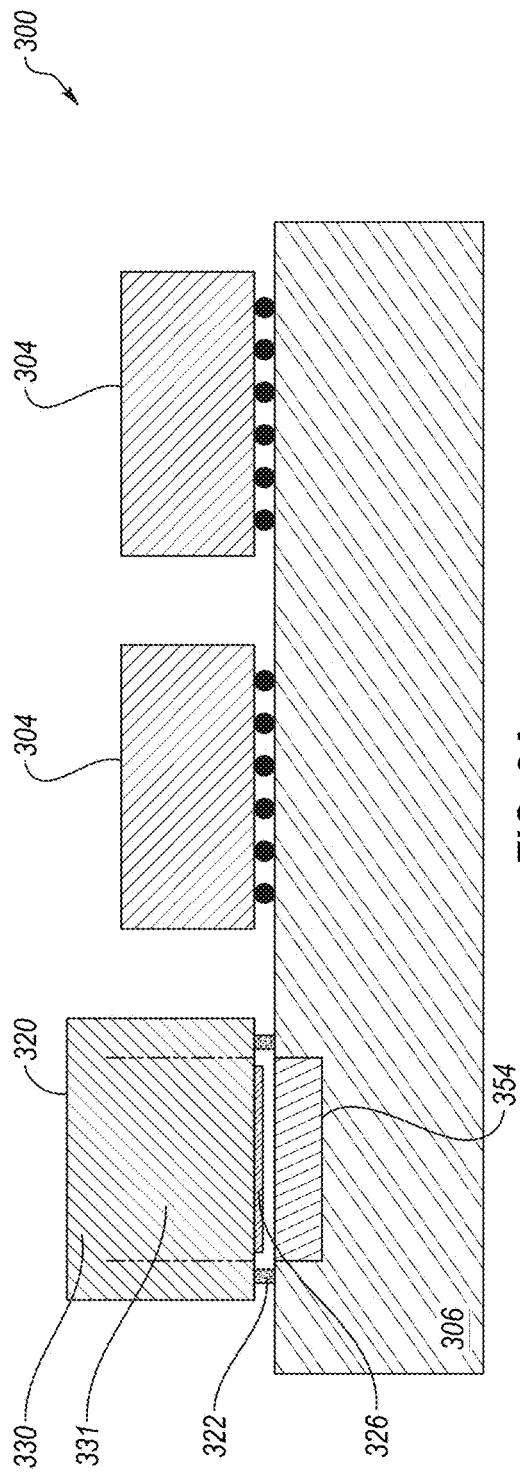
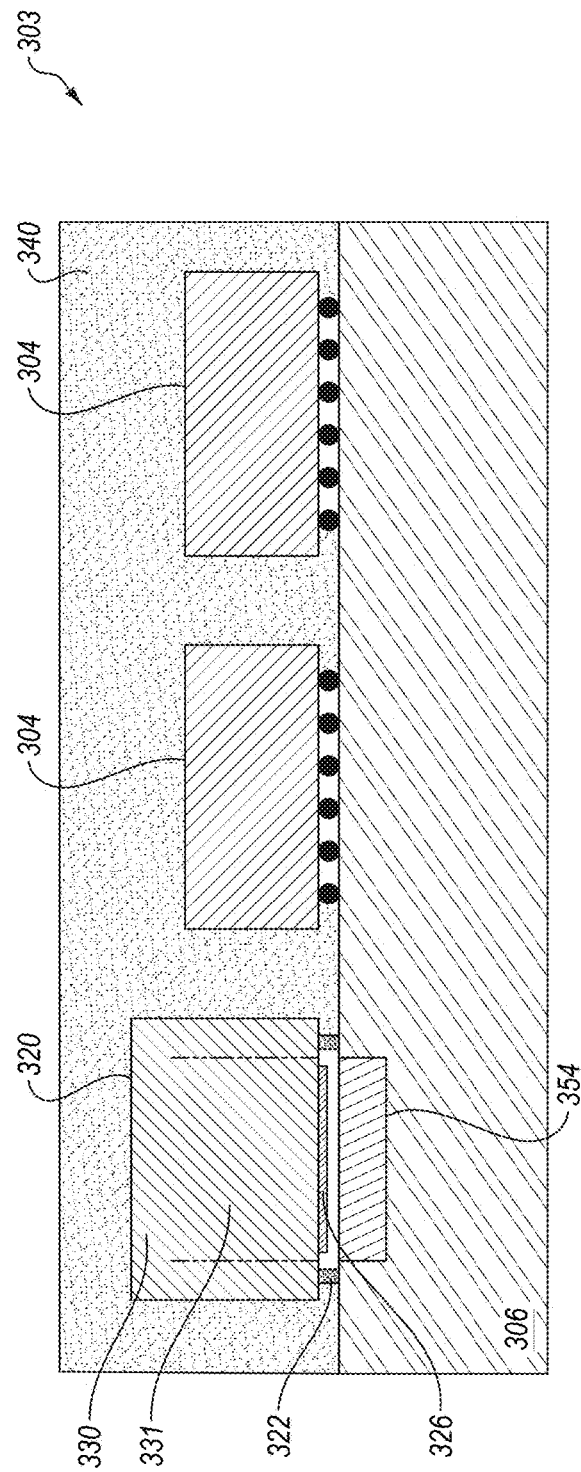

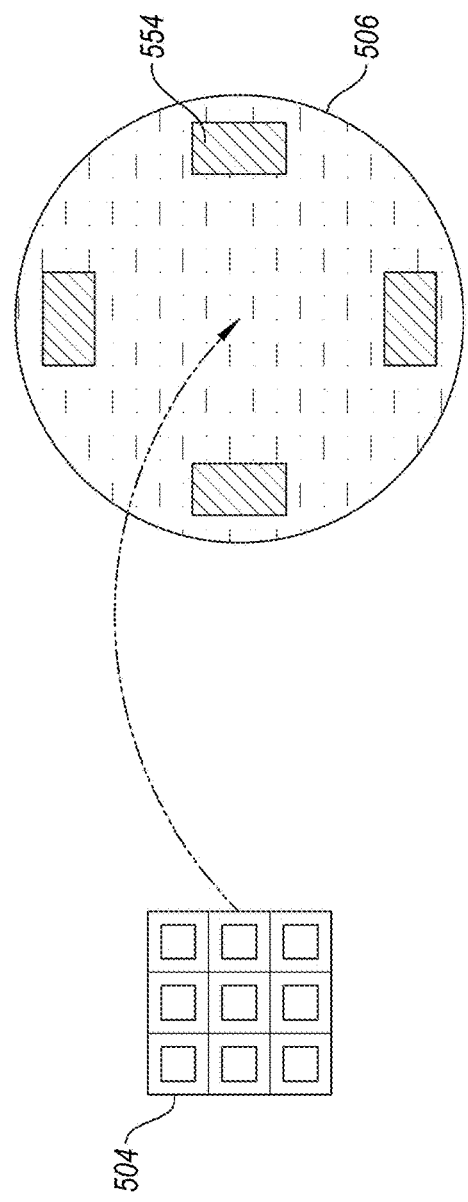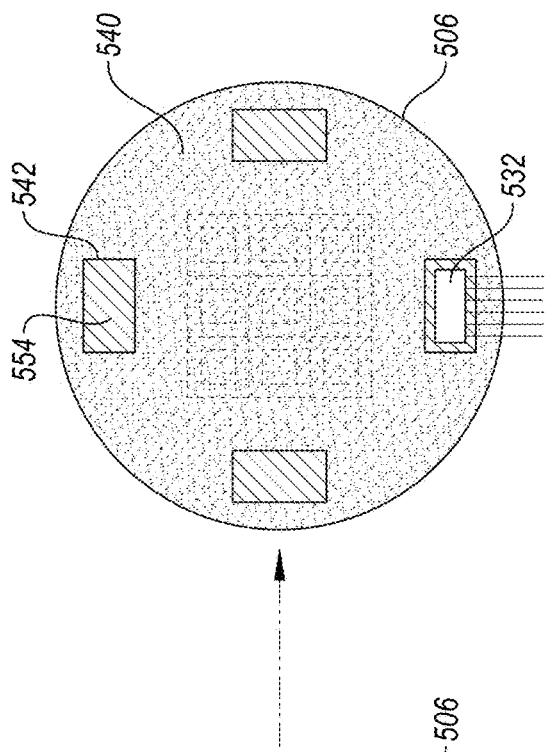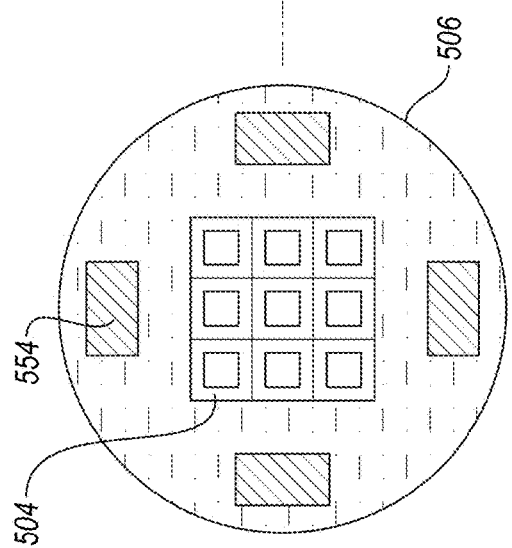
FIG. 5A
FIG. 5B
FIG. 5C

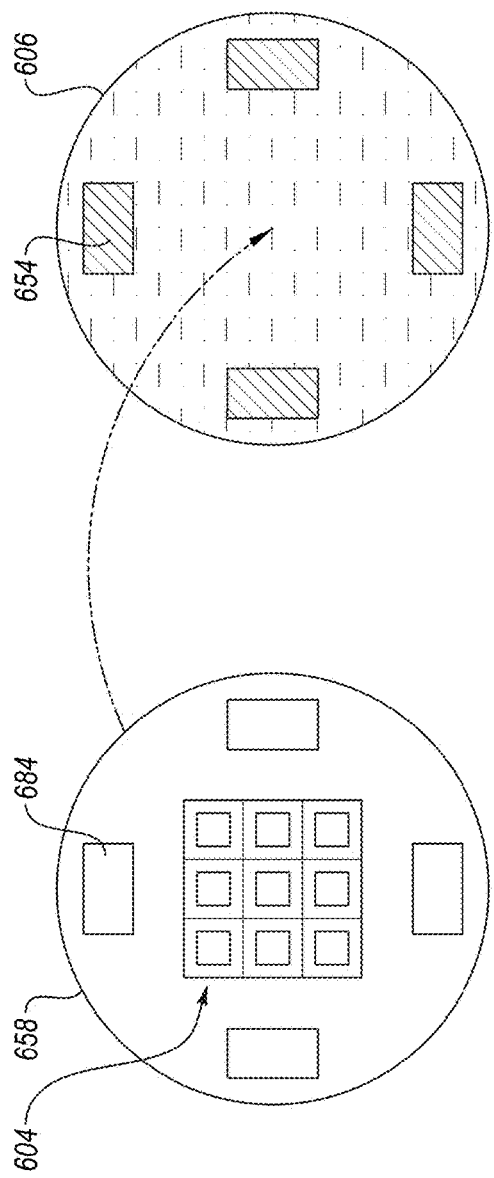
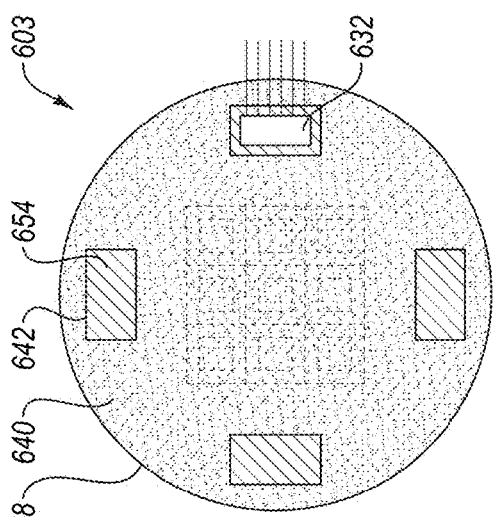
FIG. 6A
FIG. 6B

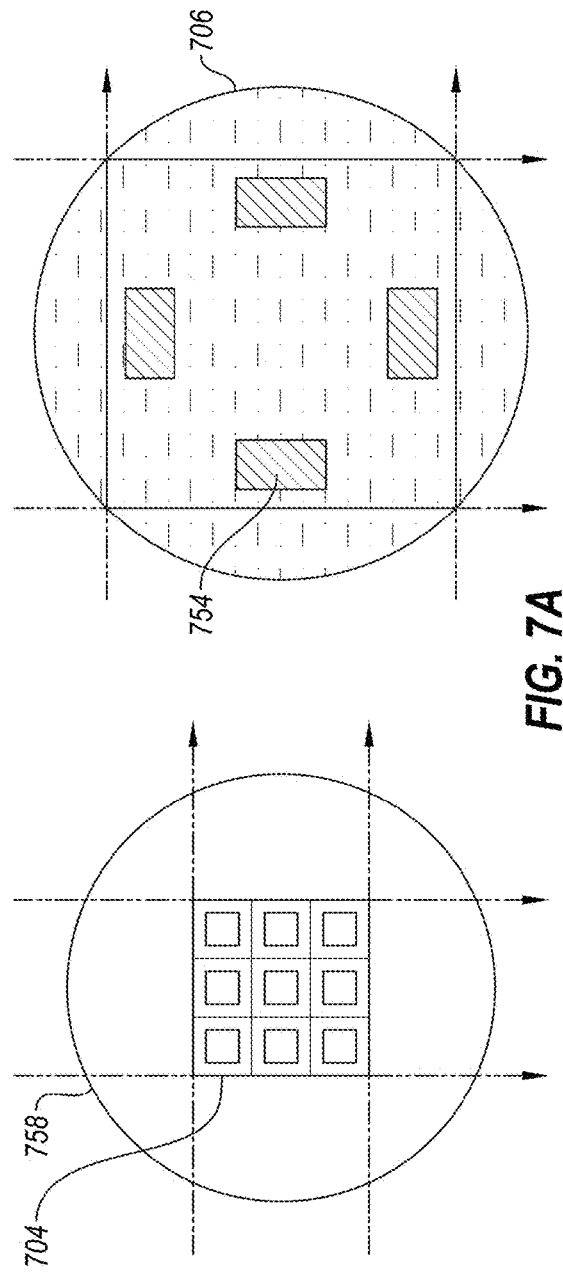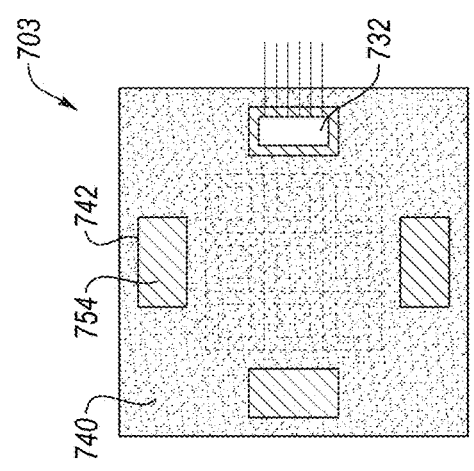
FIG. 7A
FIG. 7B

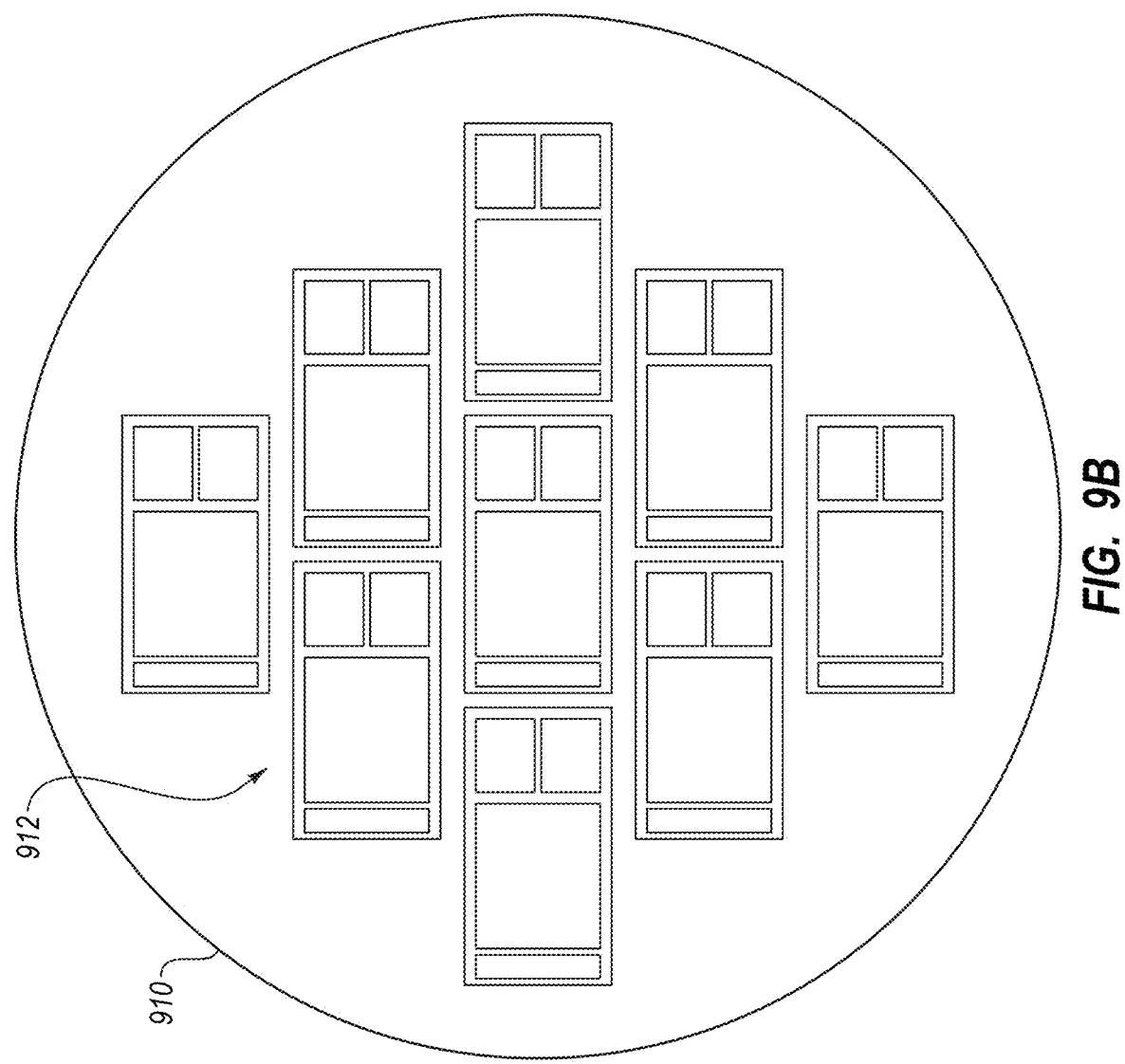

PRESERVING ACCESS TO OPTICAL COMPONENTS ON A WAFER PACKAGE WITH SACRIFICIAL DIE

CROSS-REFERENCE TO RELATED APPLICATIONS

This application claims priority to U.S. Provisional Patent Application No. 63/655,461, entitled "PACKAGING OPTICALLY ACCESSIBLE COMPONENTS", filed on Jun. 3, 2024, the entirety of which is incorporated herein by reference. This application also claims priority to U.S. Provisional Patent Application No. 63/694,684, entitled "PACKAGING OPTICAL COMPONENTS," filed on Sep. 13, 2024, the entirety of which is incorporated herein by reference.

BACKGROUND OF THE DISCLOSURE

The subject matter discussed in this section should not be assumed to be prior art merely as a result of inclusion in this section. Similarly, any problems mentioned in this section or associated with subject matter provided as background should not be construed as an admission of prior art.

Integrated circuits (ICs) with processors, especially those for executing artificial intelligence and machine learning functions, move large amounts of data among one or more processor ICs and one or more memory ICs. Chiplets may aid in the interconnection of processor dies, memory dies, and other circuits to increase the bandwidth and decrease latency and power dissipated in the process. In the event that these interconnections utilize optical elements, maintaining optical pathways through the hardware of a circuit package can become a challenge and present difficulties, particularly in manufacturing and implementing IC architectures.

BRIEF DESCRIPTION OF THE DRAWINGS

FIGS. 2A-2I show different views of a sacrificial die in accordance with one or more embodiments of the present disclosure.

FIG. 3A illustrates a side view of an example circuit package having a sacrificial molding deposited thereon, according to at least one embodiment of the present disclosure.

FIG. 3B illustrates a side view of an example a circuit package in which a molding has been applied over electrical hardware of the circuit package, according to at least one embodiment of the present disclosure.

FIGS. 5A-5C illustrate an example implementation related to packaging a wafer package and maintaining an optical window thereon, according to at least one embodiment of the present disclosure.

FIGS. 6A and 6B show an example implementation in which an electronic integrated circuit (EIC) wafer is bonded to a wafer, according to at least one embodiment of the present disclosure.

FIGS. 7A and 7B show an example implementation of creating a molded wafer package, according to at least one embodiment of the present disclosure.

FIG. 9B shows a top view of a wafer having various components disposed thereon, according to at least one embodiment of the present disclosure.

DETAILED DESCRIPTION

Figure 1:
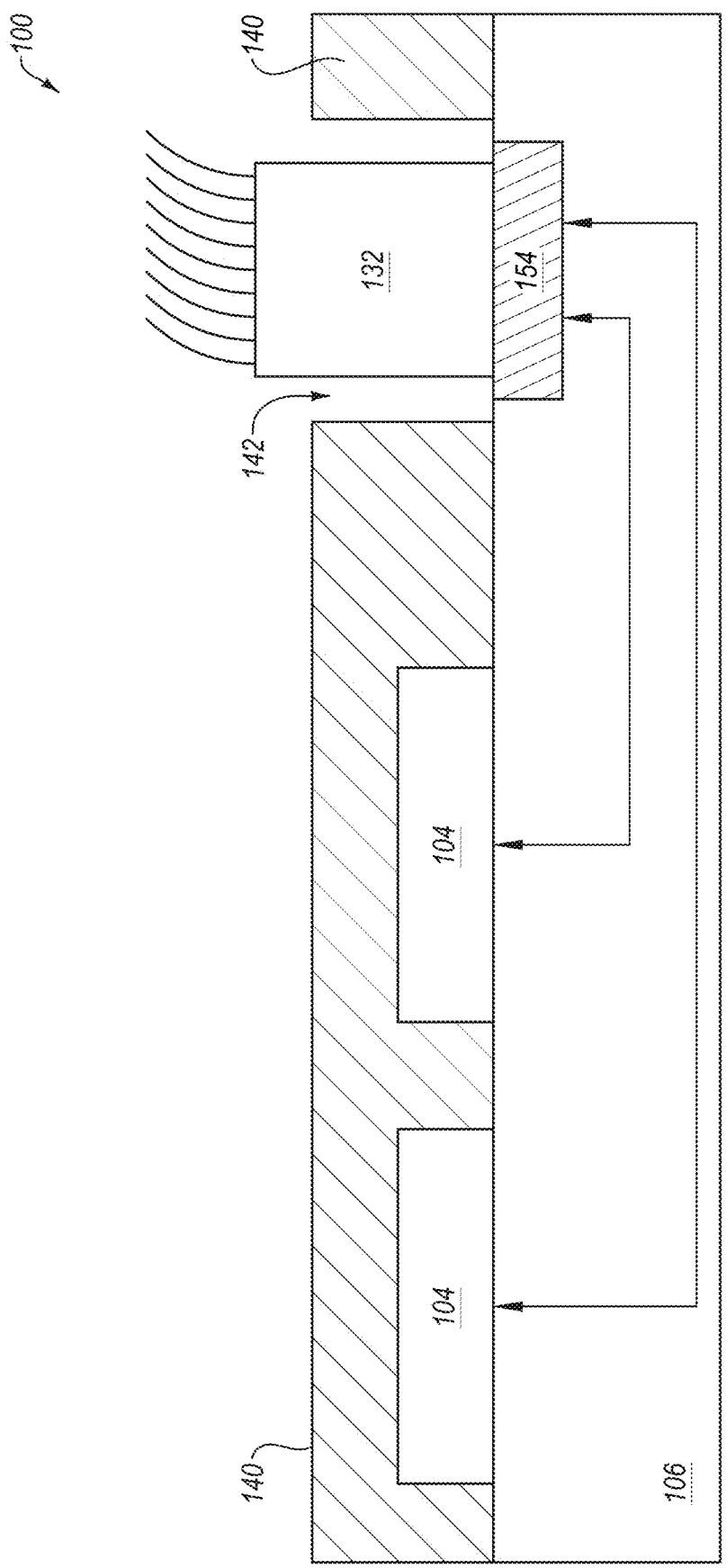
FIG. 1 illustrates an example of a circuit package 100 being configured for connecting to one or more external devices, according to at least one embodiment of the present disclosure.

The present disclosure relates to example implementations of photonic circuit packages. Indeed, implementations herein relate to facilitating communication of optical signals between components of a circuit package by providing accessibility to an optical region through a void (e.g., an optical path or optical window) formed within a molded compound layer of a circuit package. Indeed, this void provides physical and optical access to the optical region exposed on or near a surface of a wafer of a molded circuit package. For instance, where a photonic circuit package may be covered or molded with an overmold—such as to maintain mechanical integrity of a substrate and/or to secure components thereto—the present techniques facilitate providing a void, such as an optical window through the overmold for the purpose of providing an optical path to one or more optical regions on a surface of the substrate (and through a portion of the overmold). For example, one or more examples described herein relate to providing an optical path through a portion of an overmold to facilitate physical access to a grating coupler region when producing a molded circuit package.

Photonic circuit packages, and more specifically electrophonic circuit packages, can be used in an artificial intelligence (AI) accelerator, a bridge, a chiplet, or any other configuration that can benefit from photonic links on and off the package or within the package. For example, electrophotonic circuit packages may include electronic components, such as processing components, memory components and the like which operate in an electronic domain, as well as photonic components for communicating data via photonic signals in a photonic domain.

One or more embodiments of the present disclosure relate to a circuit package (or wafer package) having features and functionality in accordance with one or more examples described and illustrated herein. For example, one or more embodiments relate implementations of a circuit package. In one or more embodiments, the circuit package includes a wafer having an optical region designed to allow light to exit or enter from a top surface of the wafer and having a plurality of first electrical connections on the top surface of the wafer which do not overlap with the optical region. The wafer package may further include one or more electronic components having a plurality of second electrical connections on a bottom surface thereof, and being positioned on the top surface of the wafer such that there are electrical couplings between the plurality of first electrical connections and the plurality of second electrical connections. The circuit package may further include an overmold layer including overmold deposited over a portion of the wafer and the one or more electronic components and a void formed in the overmold layer above the optical region and extending toward a top surface of the overmold.

In one or more embodiments, walls around an interior of the void comprise portions of a sacrificial die previously placed over the optical region. In one or more embodiments, walls around the interior of the void are formed from removal of a pre-cut portion of the sacrificial die placed over the optical region prior to depositing the overmold over the portion of the wafer and the one or more electronic components. In one or more embodiments, prior to removal of the pre-cut portion of the sacrificial die, placement of the sacrificial die over the optical region prevents the overmold from flowing in an area of the void over the top surface of the wafer at the location of the optical region.

In one or more embodiments, the void provides an optical path from a top surface of the circuit package to the top surface of the wafer near the optical region. In one or more embodiments, a depth of the void is less than 1000 microns. In one or more embodiments, a cross-section of the void is approximately a same size and shape as a size and shape of the top surface of the wafer over the optical region. In one or more embodiments, a cross-section of the void has an area within which the optical region fits such that an optical component can be positioned within the void and align a plurality of optical fibers with the optical region.

In one or more embodiments, the circuit package includes an optical interface component that aligns a plurality of optical fibers with the optical region such that optical signals can pass between the waveguides and the plurality of optical fibers. In one or more embodiments, the optical interface component is a fiber array unit (FAU) aligned with the optical region.

In one or more embodiments, the one or more electronic components include one or more of a processor component, a memory component, or an analog mixed signal (AMS) block. In one or more embodiments, the wafer includes waveguides formed within the wafer and passing between the region and optical transmitter and receiver portions of the wafer.

As another example implementation, a circuit package may include a photonic integrated circuit (PIC) wafer including a region near a top surface of the PIC wafer configured to allow light to enter or exit the PIC wafer and optical transmitter and receiver portions in optical communication with the region, the optical transmitter and receiver portions having electrical interconnects to the top surface of the PIC wafer. The circuit package may further include one or more electronic components disposed on the top surface of the PIC wafer outside of the region including electrical transmitter and receiver portions interconnected via the electrical interconnects with the optical transmitter and receiver portions forming electro-optical paths to and from the one or more electronic components to the region. The circuit package may also include an overmold layer including overmold deposited over a portion of the PIC wafer and the one or more electronic components and a void formed in the overmold layer above the optical region and extending toward a top surface of the overmold.

In this and other examples, the walls around an interior of the void comprise portions of a sacrificial die previously placed over the region. In one or more embodiments, the void provides an optical path from a top surface of the circuit package to the top surface of the PIC wafer near the region. In one or more embodiments, the walls around the interior of the void are formed from removal of a pre-cut portion of the sacrificial die placed over the region prior to depositing the overmold over the portion of the wafer and the one or more electronic components. In one or more embodiments, prior to removal of the pre-cut portion of the sacrificial die, placement of the sacrificial die over the region prevents the overmold from flowing in an area of the void over the top surface of the PIC wafer at the location of the region.

In one or more embodiments, a depth of the void is less than 1000 microns. In one or more embodiments, a cross-section of the void is approximately a same size and shape as a size and shape of the top surface of the PIC wafer over the region. In one or more embodiments, a cross-section of the void has an area within which the region fits such that an optical component can be positioned within the void and couple one or more optical fibers with a grating coupler in the region. In one or more embodiments, the optical interface component is a fiber array unit (FAU).

In one or more embodiments, the one or more electronic components include one or more of a processor component, a memory component, or an analog mixed signal (AMS) block. In one or more embodiments, the PIC wafer includes waveguides formed within the PIC wafer and passing between the region and optical transmitter and receiver portions of the PIC wafer.

Additional features of the methods and devices described herein will be discussed in connection with example illustrations. For example, FIG. 1 illustrates an example of a circuit package 100 being configured for connecting to one or more external devices, according to at least one embodiment of the present disclosure. The circuit package 100 may include a substrate 106 having one or more dies 104 disposed thereon. The substrate 106 may be a photonic integrated circuit (PIC) or PIC wafer, and the dies 104 may be electronic integrated circuit (EIC) dies as described herein. More details regarding wafers, PICs, EICs, the connection therebetween, and various features and functionalities thereof is shown and described below in connection with FIGS. 9A-11C.

In addition to the dies 104 being disposed on the substrate 106, an optical region 154 may be positioned within the substrate 106. For example, the optical region 154 may refer to a grating coupler (GC) region, and may be positioned at or near a top surface of the substrate. In some cases, the optical region 154 is a region at or near the top surface of the substrate 106 through which light may pass (e.g., photonic or optical signals), enabling optical fibers to be coupled to the dies 104 via photonic paths 180 (e.g., waveguides) at least partially formed in the substrate 106. In one or more embodiments, the optical region 154 refers to a region at or near the surface of the substrate 106 that allows light to enter or exit the top surface of the substrate 106. In at least one embodiment, photonic signals are transmitted to and/or from the dies 104 through the photonic paths 180 and by way of the optical region 154 and via a fiber array unit (FAU) 122, which may be connected (via optical fibers) to one or more external devices. In this way, the optical region 154 may facilitate communication with the dies 104 via waveguides that are formed in the substrate 106. Additional information about optical regions, GC, optical interface components, and other features discussed above are shown and described below in connection with FIGS. 9A-11C.

The circuit package 100 may be processed or manufactured to include an overmold 140 which may cover the various components exposed at the surface of the substrate 106 and which secures these components in place relative to the substrate 106. The resulting molded circuit package may include the substrate 106 and dies 104 covered and/or surrounded by the overmold 140, which provides mechanical integrity for the molded circuit package and ensures that the dies 104 remain physically and electrically connected to the substrate, among other beneficial functions. Because the optical region is disposed or formed within the substrate 106, for instance, at or below a surface of the substrate 106, by disposing the overmold 140 on the substrate, the overmold 140 may cover and/or obscure access to various components in the circuit package 100. Thus, overmolding may present challenges associated with maintaining physical or optical access to substrates having any number of optical regions.

The present disclosure describes various techniques for maintaining a void (e.g., an optical window 142) or optical path through the overmold 140 such that the optical region remains uncovered and optically accessible via the FAU 122. As used herein, a void refers to an opening or window formed within an overmold layer as a result of a portion of a sacrificial die being removed from the overmold layer after the overmold 140 has dried and a pre-cut portion of the sacrificial die is separated from a remaining portion of the sacrificial die. Additional detail in connection with examples of voids or void regions will be discussed below. In one or more embodiments described herein, a void or void region is referred to as an optical window, though other implementations may refer to other openings formed within an overmold layer in which an optical path is preserved between an outside surface of a circuit package and a top surface of a substrate or wafer (e.g., a PIC wafer).

Various embodiments described herein relate to utilizing a sacrificial die which can be disposed on the substrate 106 over the optical region 154 to prevent the overmold 140 from covering the optical region 154. Based on performing a grinding process to remove some of the overmold and some of the sacrificial die, an inner portion of the sacrificial die can be freed and removed in order to reveal the optical window 142 therethrough, and ultimately, to expose the optical region 154 through the overmold 140. In this way, circuit packages including optical regions can be overmolded to created molded circuit packages while maintaining access and functionality of the optical connections that are accessible via the optical regions.

Accordingly, techniques for providing simple and direct access to optical regions (be they GCs, edge couplers, or others) of a substrate through an overmold can be advantageous and beneficial. Indeed, the present disclosure describes such techniques for providing optical windows through overmolded circuit packages as part of a process for forming the overmolded circuit packages.

Additional detail will now be provided in connection with an example process in which a sacrificial die (e.g., sacrificial component, dummy die, or dummy component) is used in providing an optical window to a portion of an optical region of a circuit package. Indeed, as mentioned above, it can be desirable to maintain an optical path from an external location of the circuit package to a GC or GC region of a circuit package (e.g., a surface of a PIC from which the GC can be accessed) such that an FAU or other component may be coupled or joined thereto for facilitating photonic signal transmission via the GC.

Figure 2A:
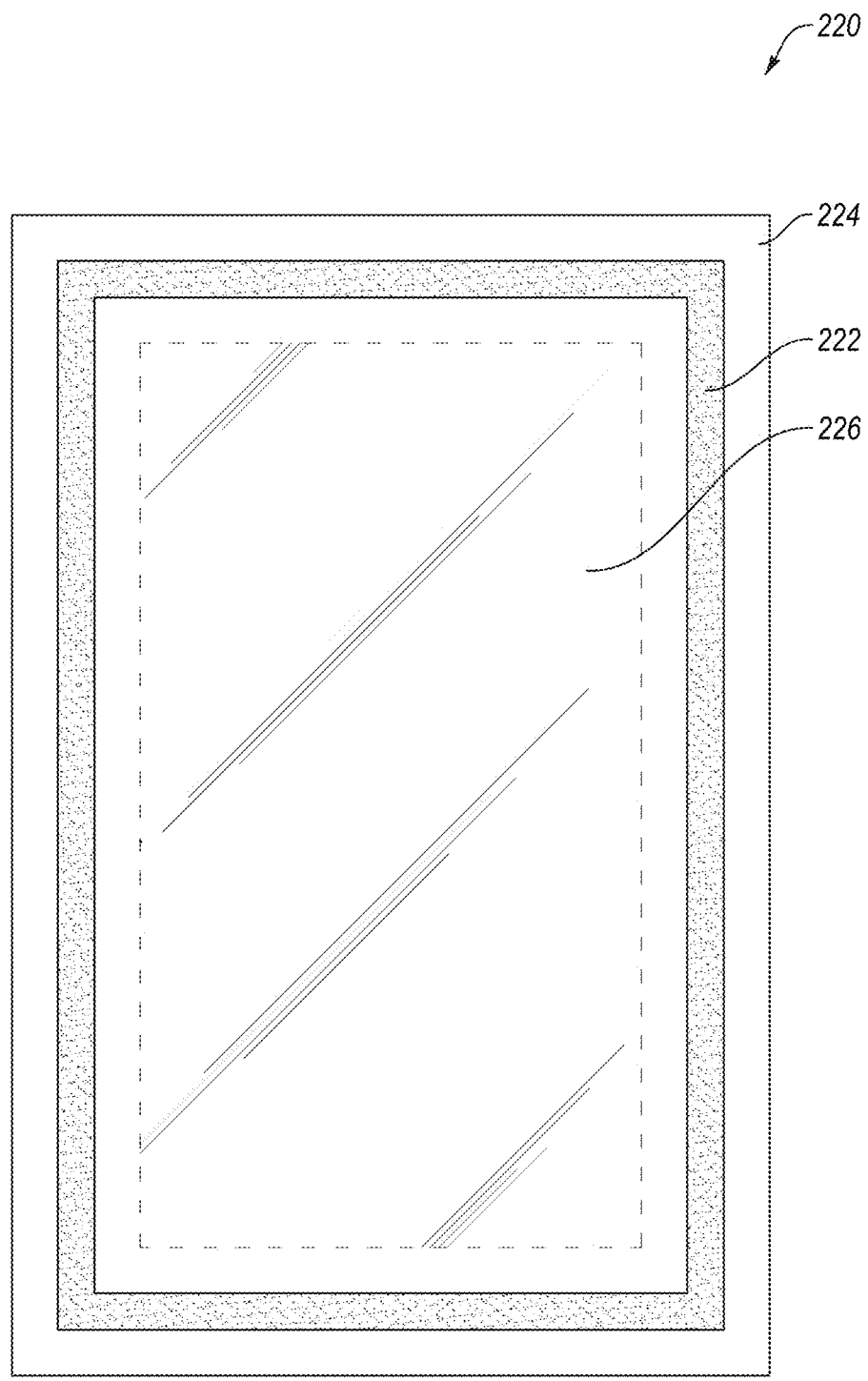
Figure 2B:
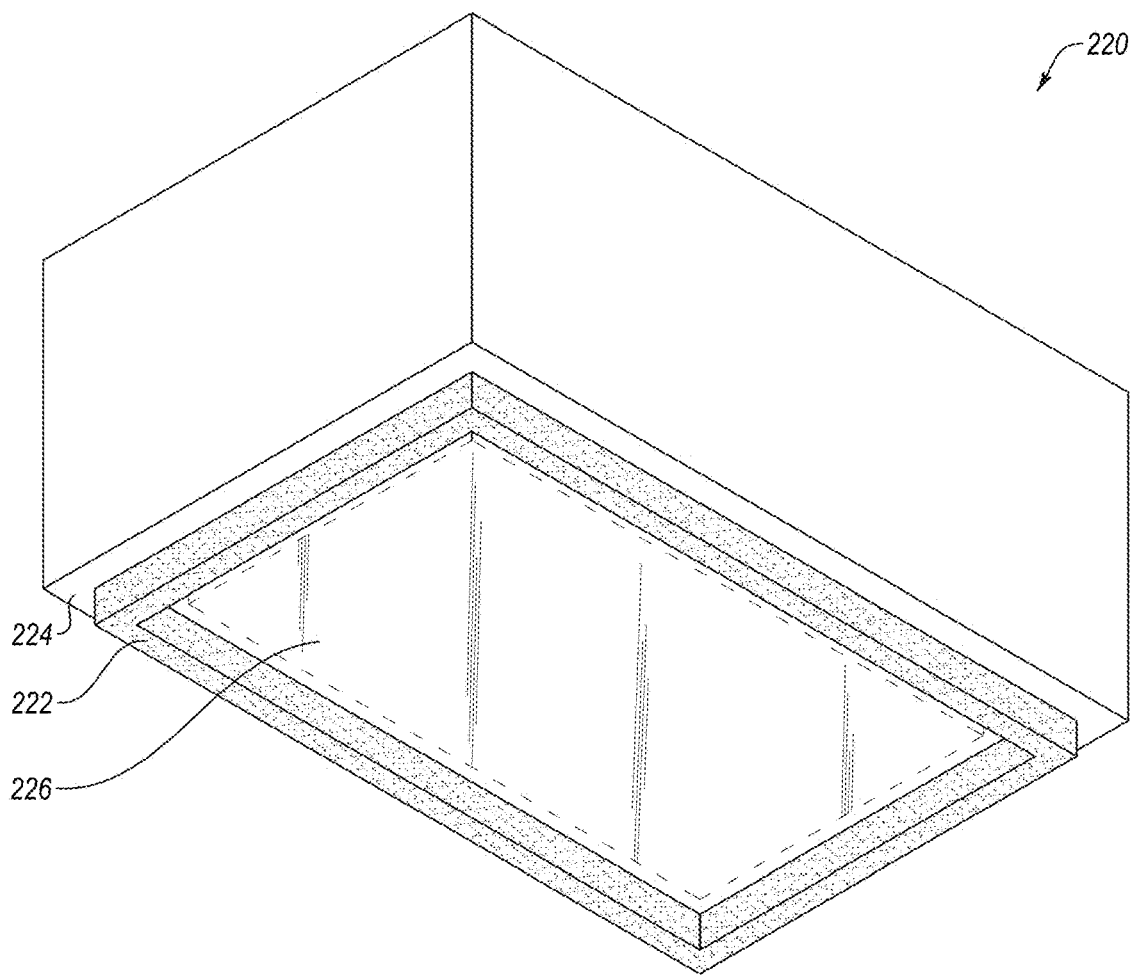
Figure 2C:
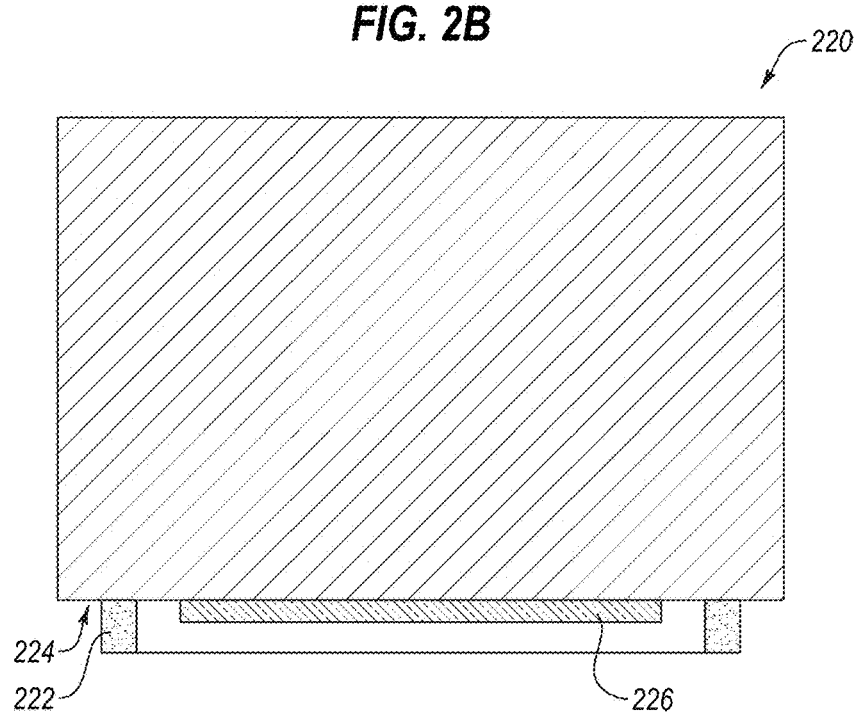

FIG. 2A shows a bottom view of an example sacrificial die 220, while FIG. 2B shows a perspective view, and FIG. 2C shows a side cross-sectional view of the sacrificial die 220, according to at least one embodiment of the present disclosure. The sacrificial die 220 may include a die having one or more sacrificial or dummy components positioned thereon. In one or more embodiments, the sacrificial die 220 may include another conventional hardware component (e.g., rather than a dummy or non-functional component) that is pre-cut for the purposes of providing access to a GC region similar to one or more embodiments described herein. For example, the sacrificial die 220 may be made entirely of a substrate or wafer material or else may have one or more sacrificial components or features disposed on the substrate. In this way, the sacrificial die 220 may refer to a dummy, or non-functional component or die which has no specific electrical function or purpose. Alternatively, the sacrificial die 220 may be representative of any generic die and/or sacrificial component which can be pre-diced, deposited over a wafer (e.g., a PIC wafer), and removed as part of the packaging processes described herein. For instance, in some cases the sacrificial die may include electronic components which may otherwise be functional or operable, but which may be utilized for sacrificial purposes.

The sacrificial die 220 may be made from any of a variety of materials. In one or more embodiments, the sacrificial die 220 is a metal or non-metal material such that an interior portion of the sacrificial die 220 can be removed (e.g., after pre-cutting and grinding as described herein) using a magnetic tool or suction tool. In one or more embodiments, the sacrificial die 220 is a silicon material, substrate, wafer material, or any other material that may be deposited over a surface of a GC region of a wafer in accordance with one or more embodiments described herein. In some cases, the sacrificial die 220 is produced in conjunction with other sacrificial dies, such as on a larger wafer substrate, and several sacrificial dies are diced or cut from the wafer to produce distinct sacrificial dies for the purposes of the present techniques.

In some cases, an adhesive layer 222 is optionally deposited on a bottom surface 224 of the sacrificial die 220. For example, the bottom surface 224 may be a surface that is made to face or contact a wafer when the sacrificial die 220 is deposited thereon. The adhesive layer 222 may be an adhesive compound or material which may facilitate fixing, bonding, securing, or otherwise positioning the sacrificial die 220 on the wafer (e.g., either permanently or temporarily) in accordance with the techniques described herein. The adhesive layer 222 may be positioned around an outside portion or boundary of the sacrificial die 220. The adhesive layer 222 may not cover an entirety of the bottom surface 224, but rather, may be positioned near a perimeter of the bottom surface 224 such that an enclosed area is defined within the adhesive layer 222. For instance, the adhesive layer 222 may be deposited along opposite sides (e.g., left and right sides and/or top and bottom sides) of the bottom surface 224 of the sacrificial die 220.

In some cases, the adhesive layer 222 is deposited at the perimeter, or can be offset from the perimeter of the bottom surface 224 as shown in the illustrated example(s). In some cases, the adhesive layer 222 is a continuous line of adhesive which may span completely around the (e.g., perimeter of) the bottom surface 224, or else may be one or more discrete sections and/or may not be entirely enclosed. As will be discussed below, the adhesive layer 222 may be deposited on the bottom surface 224 of the sacrificial die 220 to provide a mechanism for securing the sacrificial die 220 in place on a PIC wafer (and specifically over a GC region of the PIC wafer) in order to prevent an overmolding compound from flowing underneath the sacrificial die 220 and over the GC region.

In some embodiments, the adhesive layer 222 is deposited on the sacrificial die 220 prior to depositing the sacrificial die 220 on the wafer. Alternatively, in one or more embodiments, the adhesive layer 222 is deposited on the wafer (e.g., around the GC region) corresponding to a location that the sacrificial die 220 will be placed on the wafer and over the GC region. In some cases, the adhesive layer 222 may be deposited on, and the sacrificial die 220 joined to, the wafer as part of a PIC/EIC packaging process. For instance, in conjunction with joining or bonding die components and other EIC components to a PIC wafer, the sacrificial die 220 may be bonded to the PIC wafer. In one or more embodiments, the adhesive layer 222 is added and the sacrificial die 220 joined to the wafer as part of the fabrication process of the wafer (e.g., prior to adding EIC components thereto).

In some cases, in addition to the adhesive layer 222, a protective material 226 is disposed on the bottom surface 224 of the sacrificial die 220. For example, the protective material 226 may be a protective film, cover, or other component or structure which may be positioned on the bottom surface 224. As described herein, the protective material 226 may facilitate protecting or covering the GC region of a PIC wafer when the sacrificial die 220 (or an interior portion thereof) may come into contact with the GC region. For instance, in some cases the GC region (or other portion of the PIC wafer to be protected) may become damaged or scratched should the sacrificial die 220 (or a portion thereof) come into contact with the GC region. Accordingly, the protective material 226 may be made using any suitable material that may provide a barrier between the sacrificial die 220 and a surface of the wafer, such as the GC region. For instance, the protective material 226 may refer to an underfill, molding compound, or other substance that provides some material that protects or buffers the GC region from contact with the sacrificial die 220.

In some embodiment, the protective material 226 may be positioned on the bottom surface 224 of the sacrificial die 220 to cover only a portion of the bottom surface 224. For example, in the embodiment shown, the protective material 226 is deposited over an inner portion of the bottom surface 224, such as within the enclosed area defined by adhesive layer 222. In some cases, the protective material 226 may be sized and/or shaped in accordance with a GC region (or other area for protecting) of a PIC wafer. In some cases, the protective material 226 may be thinner than the adhesive layer 222. For instance, when the sacrificial die 220 is adhered or bonded to a wafer, the protective material 226 may not (initially) contact the wafer (e.g., the GC region) which may facilitate protecting the wafer from damage associated with contact by the sacrificial die 220. In other cases, the protective material 226 may contact the wafer when the sacrificial die 220 is connected thereto, and the protective material 226 may in this way provide protection against damage to the GC region.

In some cases, the protective material 226 is optional and/or not necessary for the techniques described herein. For example, a GC region of a PIC wafer may have little or no risk of being damaged, scratched, etc. To elaborate, in some cases, the sacrificial die 220 (or a separated portion thereof) may not contact the GC region, or else contact of the sacrificial die 220 with the GC region may not result in any damage to the GC region. Accordingly, the protective material 226 is shown in FIGS. 2A-2C in phantom, illustrating this optional nature.

Figure 2D:
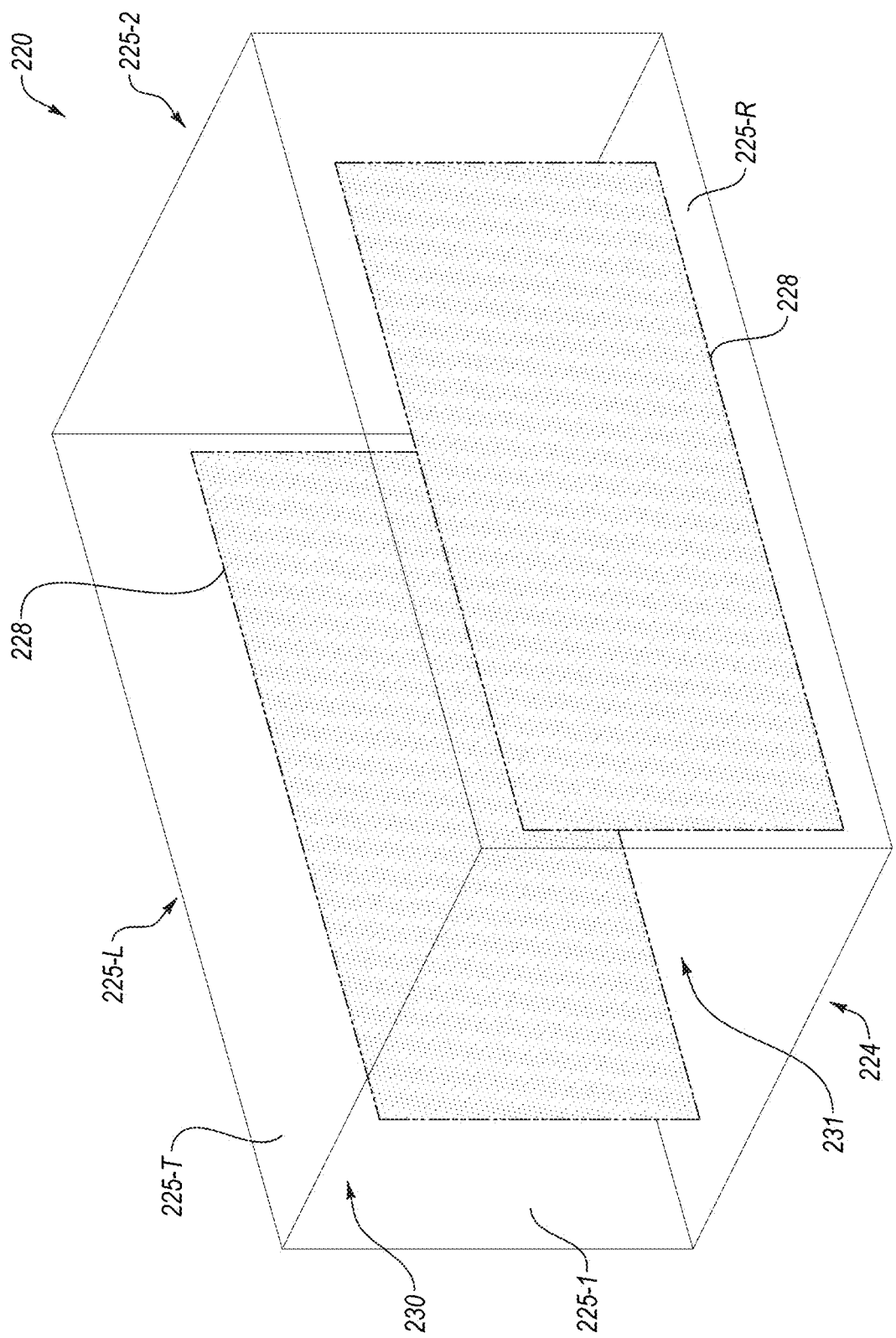
Figure 2F:
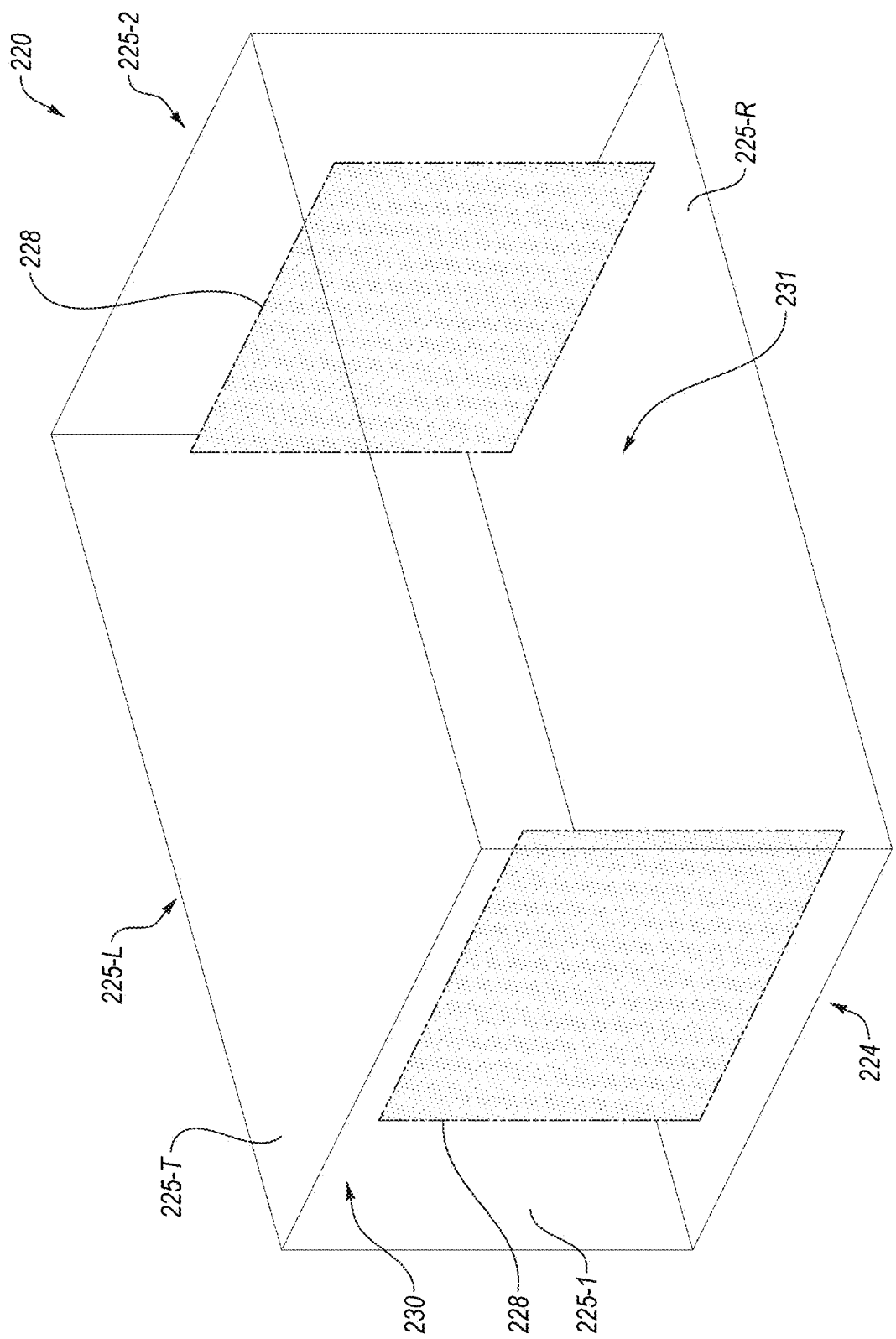
Figure 2G:
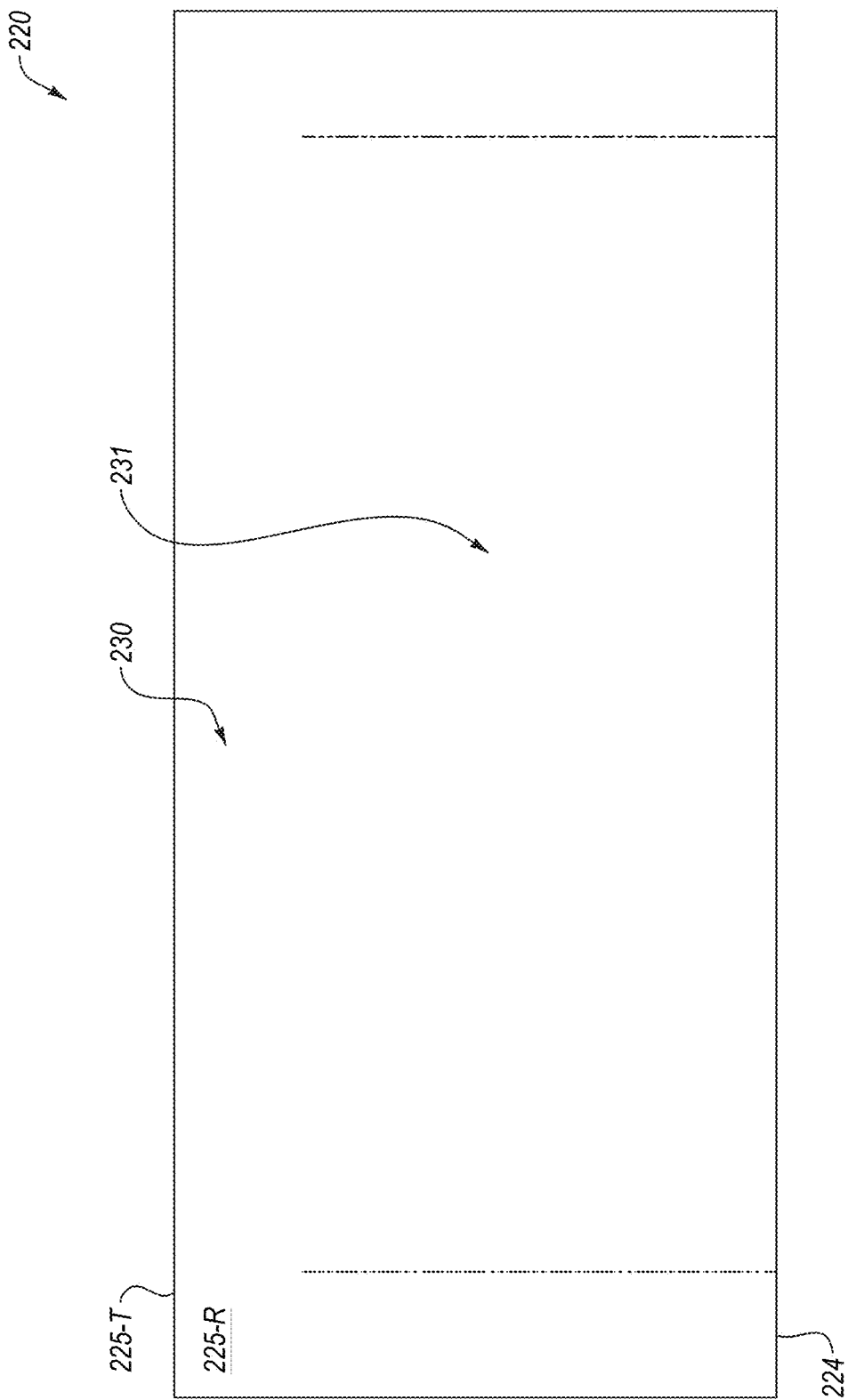
Figure 2H:
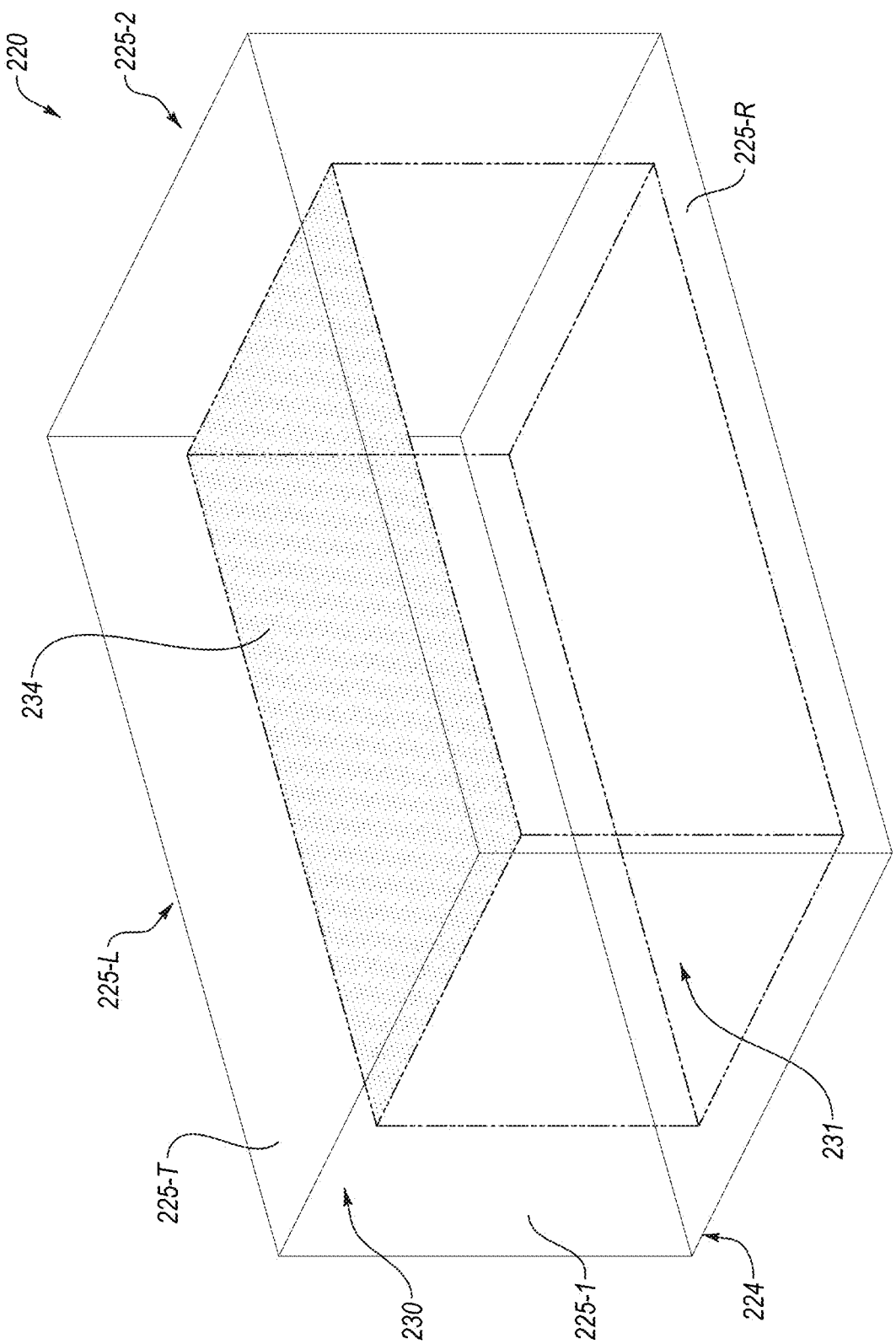

Referring now to FIGS. 2D-2I, these figures illustrate various schematic representations of the sacrificial die 220, according to at least one embodiment of the present disclosure. For example, FIGS. 2D, 2F, and 2H illustrate perspective views of the sacrificial die 220 with one or more surfaces as transparent, in order to illustrate various features of the sacrificial die 220. These figures show the sacrificial die 220 having a first end 225-1 and an opposite, second end 225-2, as well as a left side 225-L and an opposite, right side 225-R. FIG. 2E shows a corresponding side view of the first end 225-1 of the sacrificial die, and FIG. 2G shows a corresponding side view of the right side 225-R of the sacrificial die 220.

In some cases, the sacrificial die 220 is pre-cut or pre-diced. Pre-cutting or pre-dicing in this context may refer to a partial cutting, dicing, or scoring of the sacrificial die 220 as described herein for producing an interior portion 231 and an uncut portion 230. Pre-cutting or pre-dicing in this way may be in addition to (or before or after) a cutting or dicing which may be performed to produce discrete, sacrificial dies, for example, by dicing or separating the dies from a larger, wafer substrate.

The sacrificial die 220 may be pre-cut before it is positioned on a wafer (e.g., a PIC wafer). The pre-cutting of the sacrificial die 220 may be performed before or after depositing the adhesive layer 222 and/or the protective material 226 on the bottom surface 224. The sacrificial die 220 may be pre-cut based on forming one or more vertical cuts 228 in the sacrificial die 220. For instance, the vertical cuts 228 may be considered vertical with respect to the orientation shown and for ease of discussion, but may not necessarily be vertical in all orientations and in all implementations. The vertical cuts 228 may be formed or cut by a knife (or other physical cutting tool), laser, grind, etching, chemical process, or any other suitable method for forming the vertical cuts 228. The vertical cuts 228 may extend from the bottom surface 224 toward a top surface 225-T of the sacrificial die 220, and may extend partially through the thickness of the sacrificial die 220. For instance, in some cases the sacrificial die is 500-1000 microns thick, and the vertical cuts 228 may extend to within 50-100 microns of the top surface 225-T of the sacrificial die 220. In some cases, the vertical cuts 228 may extend to within 25-75 microns of the top surface 225-T of the sacrificial die 220. As an example, the sacrificial die 220 may be 500 microns thick, and the vertical cuts 228 may extend 400-450 microns from the bottom surface 224. In some cases, the sacrificial die maybe 800 microns thick, and the vertical cuts 228 may extend 700-750 microns from the bottom surface 224. As another example, the sacrificial die may be 1000 microns thick and the vertical cuts 228 may extend 900-950 microns from the bottom surface 224. In this way, the vertical cuts 228 may leave an uncut portion 230 of the sacrificial die 220 near a top surface 225-T of the sacrificial die 220 (e.g., an upper region of the sacrificial die) and may define an interior portion 231 below the uncut portion 230.

In one or more embodiments, the size and/or length of the vertical cuts 228 is determined based on a later grinding process involved in creating a circuit package using the sacrificial die 220. For example, as described herein, the sacrificial die 220 may be grinded in conjunction with grinding an overmold applied to the wafer and other components. The grinding process may be performed to remove the uncut portion 230 such that the interior portion 231 of the sacrificial die may be separated and/or removed. Accordingly, the size and/or length of the vertical cuts 228 may be determined based on an amount of grinding to be performed on the sacrificial die 220 and other components of the wafer. For example, the amount of grinding to be performed (and the length of the vertical cuts 228) may be determined to provide a mechanism to ensure that the interior portion 231 is separated from the sacrificial die 220 at an appropriate stage of the package process, as discussed below.

In some cases, four (4) vertical cuts 228 may be formed in the sacrificial die 220. For example, two (2) vertical cuts 228 may be formed in alignment (e.g., parallel) with the right side 225-R and left side 225-L (e.g., FIGS. 2D and 2E), and two (2) vertical cuts 228 may be formed in alignment (e.g., parallel) with the first end 225-1 and second end 225-2 (e.g., FIGS. 2F and 2G). For ease in discussion and illustration, only two such vertical cuts 228 are shown in each of FIGS. 2D-2G, but it should be understood that each of these vertical cuts 228 may be formed in the sacrificial die 220, totaling four vertical cuts. In this way, the vertical cuts 228 may define a prismatic shape of the interior portion 231. In some cases, other quantities and/or arrangements of vertical cuts 228 may be formed in the sacrificial die 220, for example, for forming other shapes or volumes of the interior portion 231.

As mentioned, the vertical cuts 228 may originate or extend from the bottom surface 224 and may extend (e.g., partially) toward the top surface 225-T, less than a thickness of the sacrificial die 220. In this way, the interior portion 231 may be separated from the remainder of the sacrificial die 220 on four sides or at four surfaces corresponding with the vertical cuts 228. A remaining surface (e.g., in a conceptual sense), or uncut plane 234 of the interior portion 231, as shown in FIG. 2H, may remain connected and/or continuous with the rest of the body of sacrificial die 220.

Figure 2I:
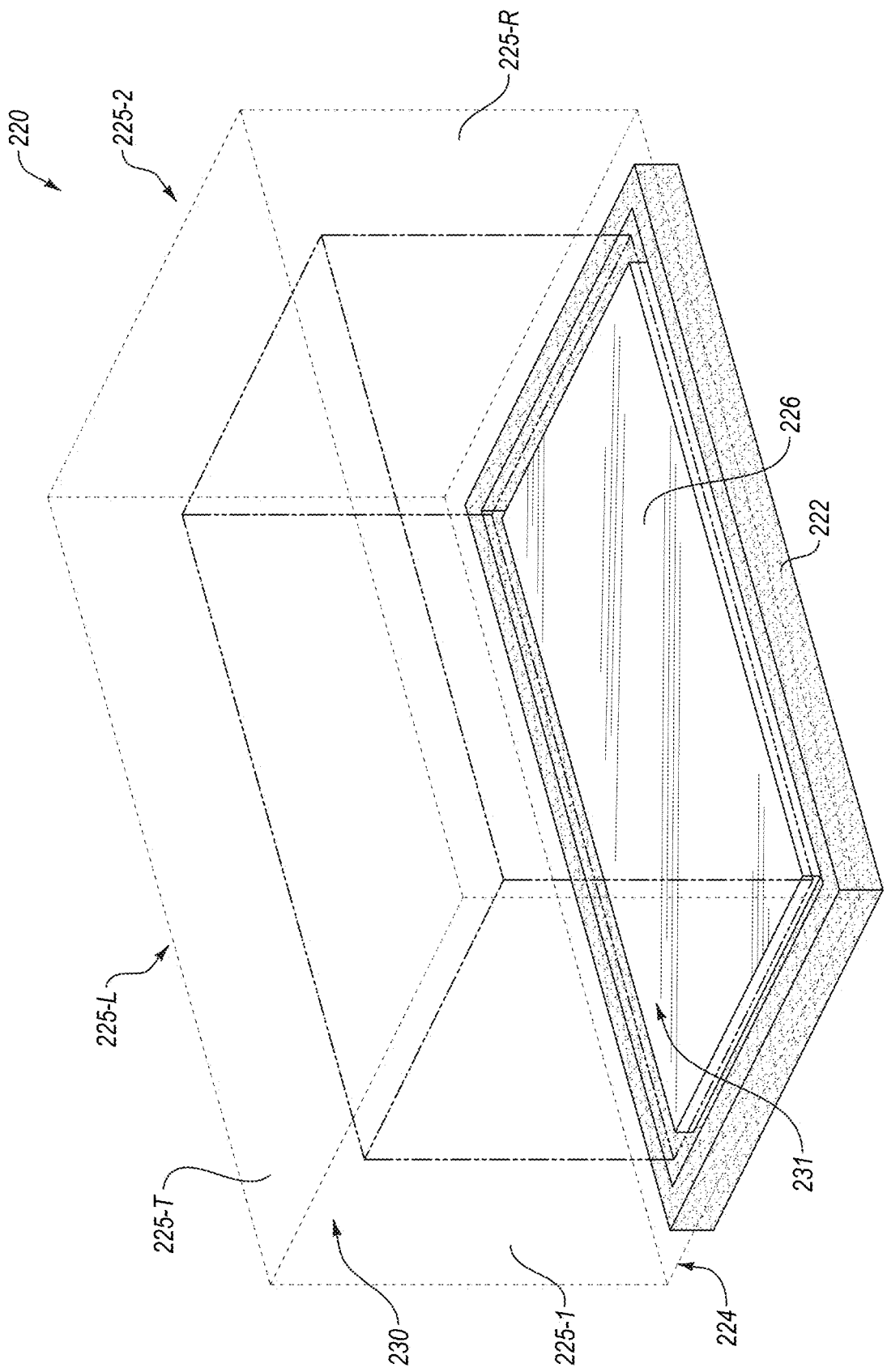

As shown in FIG. 2I, the adhesive layer 222 may be positioned on the bottom surface 224 around or surrounding the vertical cuts 228 and the interior portion 231. For instance, the adhesive layer 222 may be positioned at or offset from (e.g., larger than) the perimeter of the interior portion 231. In this way, when the sacrificial die 220 is bonded to the wafer, the interior portion 231 may not be bonded to the wafer, and additionally, the adhesive layer 222 may prevent any overmold applied to the sacrificial die 220 from penetrating to and/or contacting the interior portion 231. Additionally, the protective material 226 may optionally be positioned on the interior portion 231, such as partially or entirely covering a bottom surface of the interior portion 231. As described above, when the sacrificial die 220 is grinded and the interior portion 231 separated from the sacrificial die 220, the protective material 226 may provide a barrier to protect a GC region (or other region) from the interior portion 231 dropping, falling, or otherwise contacting the GC region.

FIG. 3A illustrates a side view of a circuit package 300, and FIG. 3B illustrates a side view of an exemplary embodiment of forming a molded circuit package 303, according to at least one embodiment of the present disclosure. For instance, the circuit package 300 may be formed of a wafer 306 (e.g., a PIC wafer) including one or more die components 304 (e.g., electronic components) disposed thereon. A sacrificial die 320 may be implemented in connection with the wafer 306 in order to provide an optical window for optical access to a GC region 354 disposed within the wafer 306 as part of a process for forming the molded circuit package 303.

The sacrificial die 320 may be a sacrificial die in accordance with one or more embodiments discussed above. For example, the sacrificial die 320 may be bonded, joined, or connected to the wafer 306 by an adhesive layer 322. The sacrificial die 320 may optionally include a protective material 326 disposed on the bottom surface of the sacrificial die 320. The sacrificial die 320 may also be precut in accordance with that discussed herein such that an inner portion 331 of the sacrificial die 320 is separated from the sacrificial die 320 on several sides of the inner portion 331, and an uncut portion 330 connects the interior portion 331 to the sacrificial die 320 near a top of the sacrificial die 320.

As shown, the sacrificial die 320 may be positioned on the wafer 306 above the GC region 354. The GC region 354 may be representative of a GC (or other optical regions) positioned within the wafer 306, or may be a region of several GCs (or other optical regions). The adhesive layer 322 may be positioned around or surrounding the GC region 354 such that GC region 354 is contained within an area defined by the adhesive layer 322. In some cases, the adhesive layer 322 is positioned entirely around a perimeter of the GC region 354, or may be positioned around a portion of the perimeter of the GC region 354, such as on two opposite sides of the GC region 354. As shown, some measure of space may exist between the sacrificial die 320 and the wafer 306 when the sacrificial die 320 is placed in position (e.g., adhered) over the GC region 354. This space may result from the adhesive layer 322, or one or more additional components may be incorporated for elevating the sacrificial die 320 above the wafer 306. In this way, the sacrificial die 320 may be bonded, adhered, or otherwise connected to the wafer 306.

As shown in FIG. 3B, a molding compound may be applied or disposed on the wafer 306 and the components disposed thereon to create an overmold 340. For example, the overmold 340 may be comprised of a molding compound deposited over the die components 304 and over a top surface of the wafer 306. Additionally, the molding compound may be deposited over the sacrificial die 320. The overmold 340 may be made from a variety of materials having various properties. For example, in one or more embodiments, the overmold 340 is an epoxy molding compound in a liquid form that hardens and/or cures to secure elements of a circuit package in place when deposited over a surface of the circuit package. The overmold 340 covers each of the components positioned on the wafer 306 and fills in gaps between (and in some cases underneath) the components to cover any exposed and/or vacant areas of the circuit package 300. In this way the molded circuit package 303 may be created by applying the overmold 340 to the wafer 306.

The connection of the sacrificial die 320 to the wafer 306 may prevent the overmold 340 from penetrating or flowing between the sacrificial die 320 and the wafer 306. For example, by virtue of the adhesive layer 322, the overmold 340 may not fill in a space underneath the sacrificial die 320. In this way, the overmold 340 may not cover, contact, or flow to the GC region 354. Thus, an area under the sacrificial die 320 may be at least partially preserved to be exposed at a later stage in this packaging process as described herein.

FIGS. 4A through 4D illustrate side schematic views of a molded circuit package 403 specifically zoomed in on a sacrificial die 420 after an overmold 440 has been applied, according to at least one embodiment of the present disclosure. For instance, the molded circuit package 403 may be a molded circuit package in accordance with that described in connection with FIGS. 3A and 3B.

In some embodiments, after the overmold 440 has dried, cured, and/or hardened, one or more layers of overmold 440 may be removed. For example, the molded circuit package 403 may be operated on to perform a grinding process 480, which may remove a layer 403-1 of the molded circuit package 403. For instance, the layer 403-1 may be grinded, milled, etched, or otherwise removed from the molded circuit package 403. In some cases, the layer 403-1 may include a portion of the overmold 440. In some cases, a portion of the sacrificial die 420 is removed in the layer 403-1 as part of the grinding process 480. For instance, an uncut portion 430 of the sacrificial die 420 as described herein may correspond with the layer 403-1 and may be removed by the grinding process 480. In particular, the grinding process 480 may be implemented in connection with the thickness of the uncut portion 430 and or a thickness of an interior portion 431 of the sacrificial die 420 such that the grinding process 480 removes the layer 403-1 at a thickness corresponding with an entirety (or more) of the uncut portion 430 being removed from the sacrificial die 420.

In this way, the grinding process 480 may not only remove some of the overmold 440, but may also grind or cut away the sacrificial die 420 to a degree such that the layer 403-1 overlaps or intersects vertical cuts 438 formed in the sacrificial die 420 as described herein. Accordingly, based on removing the layer 403-1 and the uncut portion 430, the interior portion 431 of the sacrificial die 420 may be separated or freed from the remainder of the sacrificial die 420. For instance, because the interior portion 431 is not adhered to the wafer 406 by the adhesive layer, and because the interior portion 431 is not directly covered by or disposed within the overmold 440, the interior portion 431 may become free, loose, detached, or separated based on the grinding process 480.

Figure 4A:
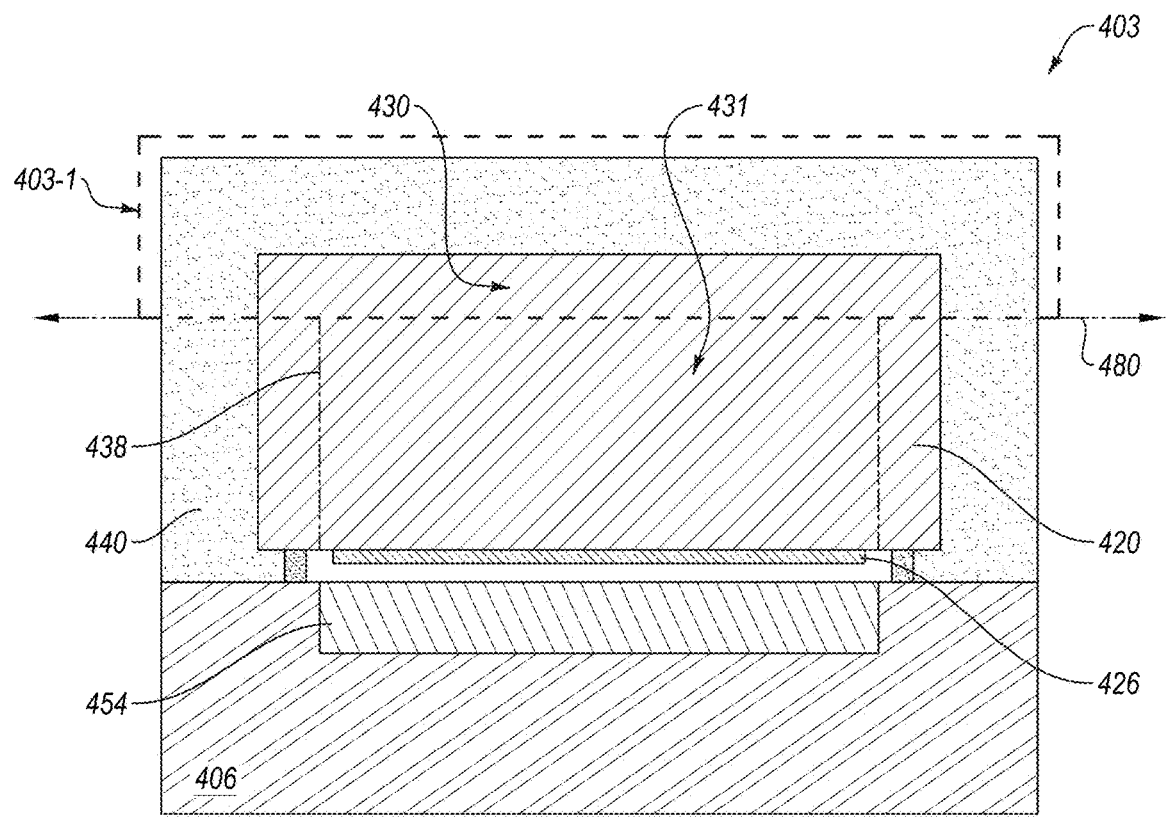
FIGS. 4A-4D illustrate side views of a portion of an example circuit package showing preservation of an optical window to a wafer, according to at least one embodiment of the present disclosure.
Figure 4B:
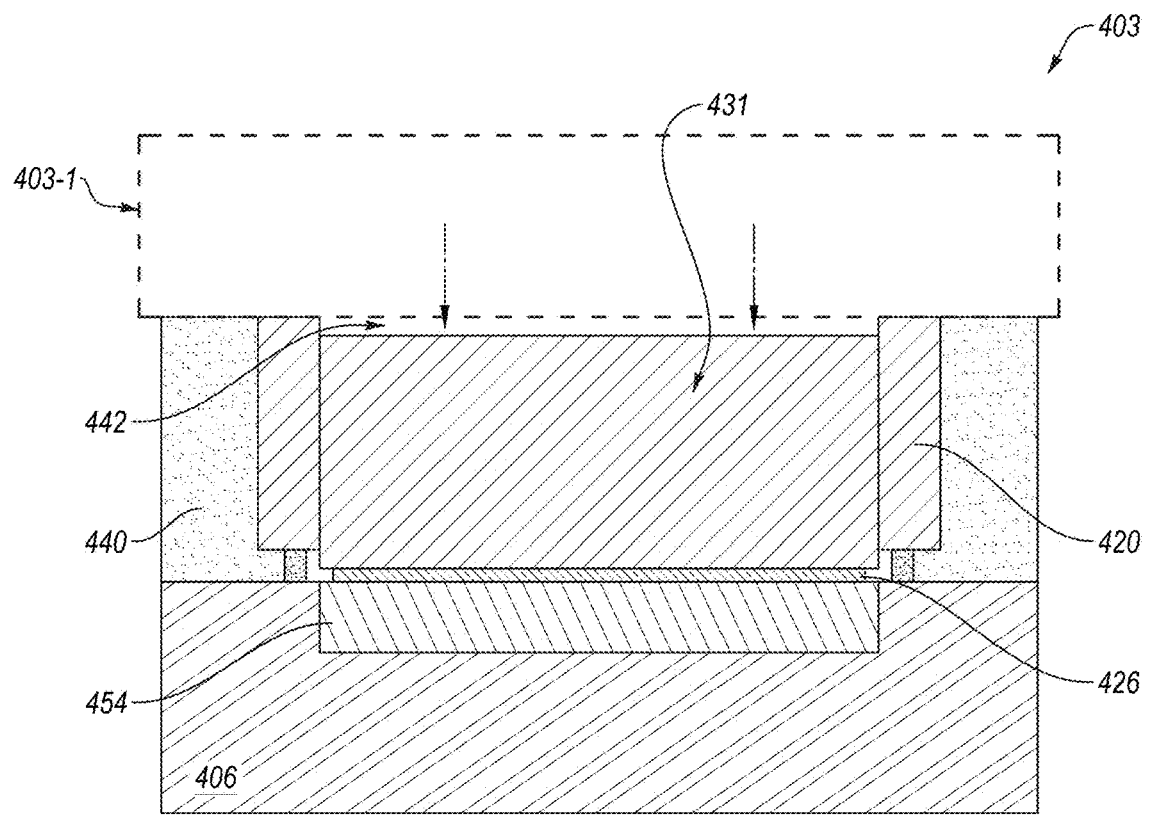

As shown in FIG. 4B, in some cases, due to the grinding process 480 (e.g., and also due to the pre-cutting or pre-dicing of the sacrificial die 420), the interior portion 431 that has been separated from the sacrificial die 420 may become loose, may fall, and/or may come into contact with the wafer 406 at the GC region 454. More specifically, because the interior portion 431 is separated from the sacrificial die 420, in some cases the interior portion may become loose within an optical window 442 within the sacrificial die 420, and a bottom surface of the interior portion 431 may come into contact with the wafer 406 at the GC region 454. As described herein, in some cases the interior portion 431 may include a protective material 426 which may facilitate protecting or preventing damage to the GC region 454. However, in some cases, such a protective material is not necessary and the GC region 454 may nevertheless not become damaged due to contact with the interior portion 431. In some cases, the interior portion 431 may become separated within the optical window 442 but may nevertheless not contact the wafer 406 and/or the GC region 454.

Figure 4C:
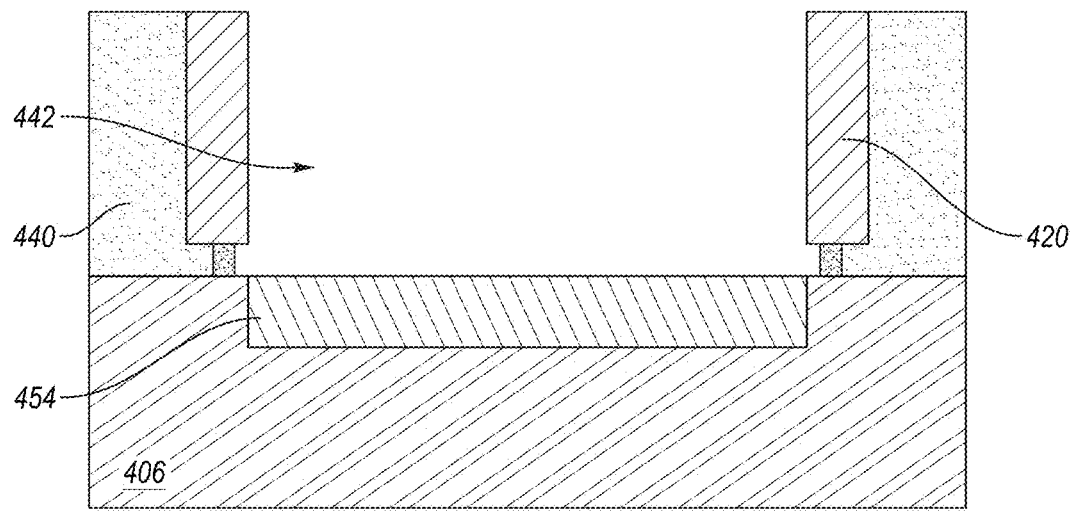

As shown in FIG. 4C, in some cases, the interior portion 431 is removed. For instance, the interior portion 431 may be vacuumed or suctioned away, may be adhered to and pulled away with a tape or adhesive, may be grasped and removed with a tool or implement, or any other suitable means that is designed to clean up or removed discrete components from a circuit package. In cases where the sacrificial die 420 is made of a metal material, the interior portion 431 may be removed with a magnet.

As shown, after the interior portion 431 is removed, an optical window 442 is now available that provides direct access to the GC region 454 on the wafer 406. For instance, the optical window 442 may extend and/or provide access through the overmold 440, such that the GC region 454 may be directly accessible through the overmold 440. For example, the optical window 442 (e.g., corresponding with a dimension of the removed interior portion 431) may span substantially all of the GC region 454.

Figure 4D:
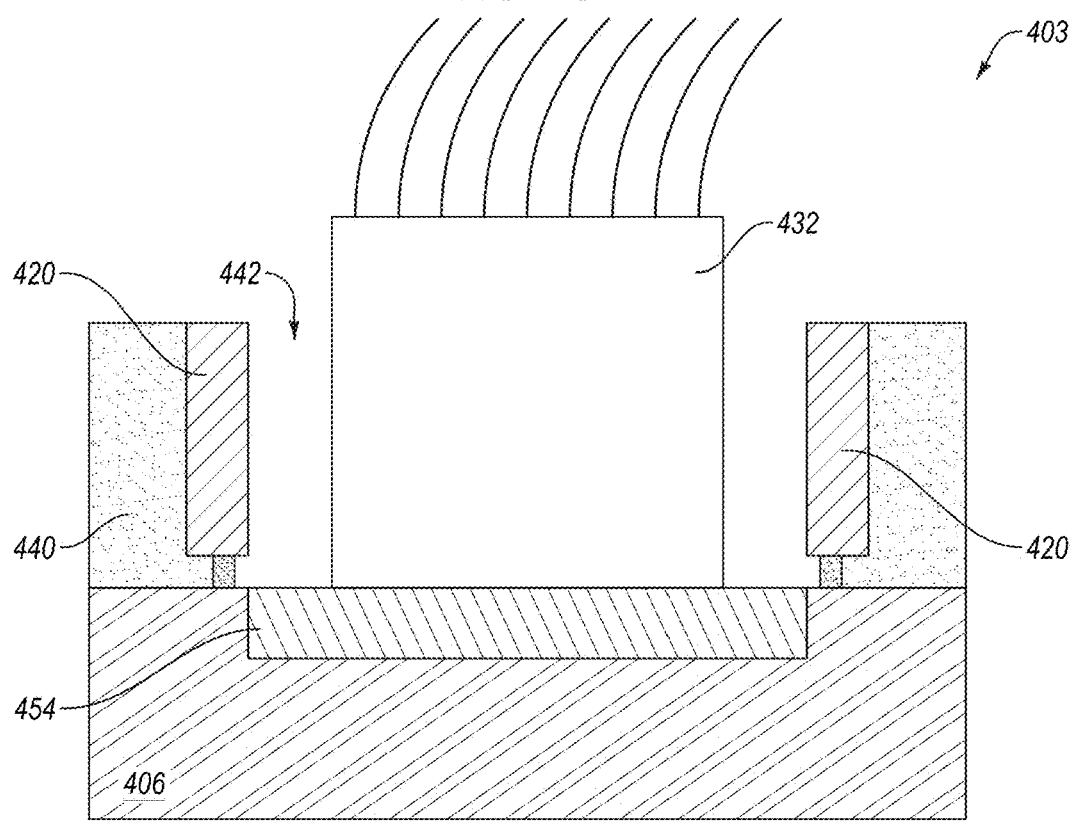

As noted above, this optical window 442 is beneficial and provides advantageous access for one or more external components to interface with the wafer 406 at the GC region 454. For instance, as shown in FIG. 4D, an FAU 422 (or other optical interfacing component) can be inserting into and/or through the optical window 442 (e.g., through the opening in the overmold 440) such that the FAU 422 can couple with the GC region 454. The coupling of the FAU 422 and the GC region 454 may provide a mechanism whereby components of the molded circuit package 403 can communicate data with an external device by transmitting and receiving photonic signals via the GC region 454 and FAU 422 (or other photonic componentry).

As shown in FIG. 4C, and as discussed above in connection with an optical window that is formed within the overmold layer of the resulting molded circuit package, a void is formed in the overmold layer above the optical region (e.g., the GC region 454) and extending toward a top surface of the overmold 440. In this example, the walls around an interior of the void include portions of the sacrificial die (e.g., the portion of the sacrificial die that is not pre-cut) previously placed over the optical region. As shown in FIG. 4C, the void provides an optical path from a top surface of the circuit package 403 to the top surface of the wafer (e.g., a PIC) near the optical region.

FIGS. 5A-5C illustrate an example implementation related to packaging a wafer package and maintaining an optical window thereon, according to at least one embodiment of the present disclosure. In the illustrated example, a die component 504 may include a plurality of electronic components, such as memory components (e.g., high-bandwidth memory), processing components, or others. In some cases, the die component 504 includes a wafer base with multiple components disposed thereon, and the wafer base is bonded and electrically connected to the wafer 506. The die component 504 may be produced as one or more electronic components disposed on a wafer structure, and cut or diced to a final shape and/or dimension.

The die component 504 may be positioned on a wafer 506 and bonded thereto. The wafer 506 includes one or more GC regions 554 which may be positioned around a periphery of the die component 504. In this example, the wafer 506 may include any number of GC regions 554 that have been formed or otherwise deposited within the structure of the wafer 506. In this example, four GC regions 554 are shown around a perimeter area of the wafer 506, and around a positioning of the die component 504 on the wafer 506. Other examples may include fewer or additional GC regions 554. These GC regions 554 may be placed at any position within the structure of the wafer 506.

As shown in FIG. 5B, the die component 504 may be placed or otherwise deposited on a top surface of the wafer 506. In this example, the die component 504 structure is bonded to a top surface of the wafer 506 in a middle section of the wafer 506 with each of the GC regions 554 of the wafer 506 around an outside of the die component 504. Moreover, while this illustrated example shows nine dies positioned between four GCs, it will be understood that a wafer package may include hundreds or thousands of dies as well as many additional GC regions (e.g., 10s, 100s, 1000s) that are positioned around a perimeter or between dies as may serve a particular embodiment. When exposed in accordance with the techniques described herein, the GC regions 554 may include a structure or mechanism for receiving optical interface components, such as FAUs.

As shown in FIG. 5C an overmold 540 can be applied to the wafer 506 and die component 504, to create a molded wafer package. A portion or layer of the overmold 540 can be grinded off as described herein (e.g., in connection with FIGS. 4A-5D). In this example, optical windows 542 are preserved through the overmold 540 at each of the GC regions 554 despite the overmold 540 being applied over an entire top surface of the molded wafer package. These optical paths may be preserved in accordance with one or more embodiments described herein. Maintaining the optical windows 542 enables optical interface components, such as FAUs 622, to be coupled to the GC regions 554 to provide a connection between one or more external or off-chip devices to the electrical and optical components of the molded wafer package as described herein.

While not specifically shown in FIG. 5C, the optical windows 542 may be maintained using one or more of the techniques described herein. To elaborate, the optical windows 542 may be created using a sacrificial die disposed on the wafer 506 over the GC regions 554, after which a portion of the sacrificial die is partially grinded off as described herein to expose the optical windows 542.

FIGS. 6A and 6B show another example implementation in which an EIC wafer 658 is bonded to a wafer 606, according to at least one embodiment of the present disclosure. The EIC wafer 658 may be a wafer structure having one or more electronic components 604 disposed on and bonded thereto. For example, the electronic components 604 may be disposed directly onto the EIC wafer 658, or one or more electronic components may be disposed on a separate die (e.g., substrate material) which is then joined onto the EIC wafer 658.

As shown in FIG. 6A the EIC wafer 658 may be pre-cut, or may include one or more pre-cut portions 684 through the EIC wafer 658 which have been pre-cut or pre-diced partially or entirely through a substrate of the EIC wafer 658. In some cases, the EIC wafer 658 is substantially the same size and shape as the wafer 606. Alternatively, the EIC wafer 658 may have a different size and/or shape as the wafer 606. The EIC wafer 658 may be positioned over the wafer 606 and bonded thereto, as shown in FIG. 6B. Additionally, an overmold 640 is applied to the EIC wafer 658 (e.g., and any exposed upper surface of the wafer 606 in cases where the EIC wafer 658 is a different size and/or shape than the wafer 606) to create a molded wafer package 603.

The pre-cut portions 684 of the EIC wafer 658 may correspond to and/or align with locations of GC regions 654 of the wafer 606. In this example, the EIC wafer 658 includes four pre-cut portions 684 that correspond to four GC regions 654 on the wafer 606. The EIC wafer 658 may include additional or fewer pre-cut portions 684 corresponding to a similar number of GC regions 654 of the wafer 606.

In this example, the EIC wafer 658 is bonded to the wafer 606 such that a bottom surface of the EIC wafer 658 contacts with and bonds to a top surface of the wafer 606. When bonding these wafers together, the pre-cut portions 684 and the GC regions 654 align such that the GC region(s) 654 in furtherance of one or more techniques for maintaining optical windows 642 at the GC regions 654 through the overmold 640.

In some cases, the optical windows 642 may be created using a sacrificial die positioned on the EIC wafer 658 at and over the pre-cut portions 684. In some cases, the EIC wafer 658 may comprise at least a portion of the sacrificial die as described herein. For example, rather than positioning a sacrificial die (e.g., as a separate component) on the EIC wafer 658, the sacrificial die techniques may be implemented as a pre-cutting, pre-dicing, or scoring of the EIC wafer 658 at the locations of the pre-cut portions 684. In other examples, one or more separate, sacrificial die components may be positioned on the EIC wafer 658 at the locations of the pre-cut portions 684. In this way, a grinding process may remove a portion of the sacrificial die which may expose the optical windows 642 therethrough.

As shown in FIG. 6B, after the molded wafer package 603 has been fabricated and packaged, and the optical windows 642 formed therein, optical interface components, such as FAUs 622 may be coupled to the GC regions 654 which may provide connectivity to one or more external or off-chip device through photonic communication via the GC regions 654.

FIGS. 7A and 7B show another example implementation of creating a molded wafer package 703, according to at least one embodiment of the present disclosure. An EIC wafer 758 may include one or more electronic components 804 disposed thereon, either directly or through one or more separate die/substrate structures as described herein. The EIC wafer 758 may be diced one or more times to create a first shape having first dimensions of the EIC wafer 758, such as a rectangular wafer structure as shown. In a similar manner, a wafer 706 may be diced one or more times to create a second shape having second dimensions of the wafer 706. The wafer 706 may have one or more GC regions 754 deposited in or on the wafer 706.

In the illustrated example, the first shape and first dimensions of the sliced EIC wafer 758 may be different than the second shape and second dimensions of the diced wafer 706. For instance, the first shape and first dimensions of the EIC wafer 758 may be smaller than the second shape and second dimensions of the wafer 706. In this way, the EIC wafer 758 may fit within an area of the wafer 706. More specifically, the EIC wafer 758 may fit within an area of the wafer 706 without covering the GC regions 754 of the PIC wafer 706. Accordingly, the EIC wafer 758 may be positioned on and bonded to the PIC wafer 706.

As shown in FIG. 7B, an overmold 740 may be applied to the top surface of the EIC wafer 758 and exposed portion of the top surface of the wafer 706 to create a molded wafer package 703. Similar to other examples discussed above, optical windows 742 may be preserved through the overmold 740 to the GC regions 754. These optical windows 742 may be preserved using any of the techniques described herein, such as using one or more sacrificial dies. Maintaining the optical windows 742 enables optical interface components, such as FAUs 722, to be coupled to the GC regions 754 to provide a connection between one or more external or off-chip devices to the electrical and optical components of the molded wafer package 703 as described herein.

Figure 8A:
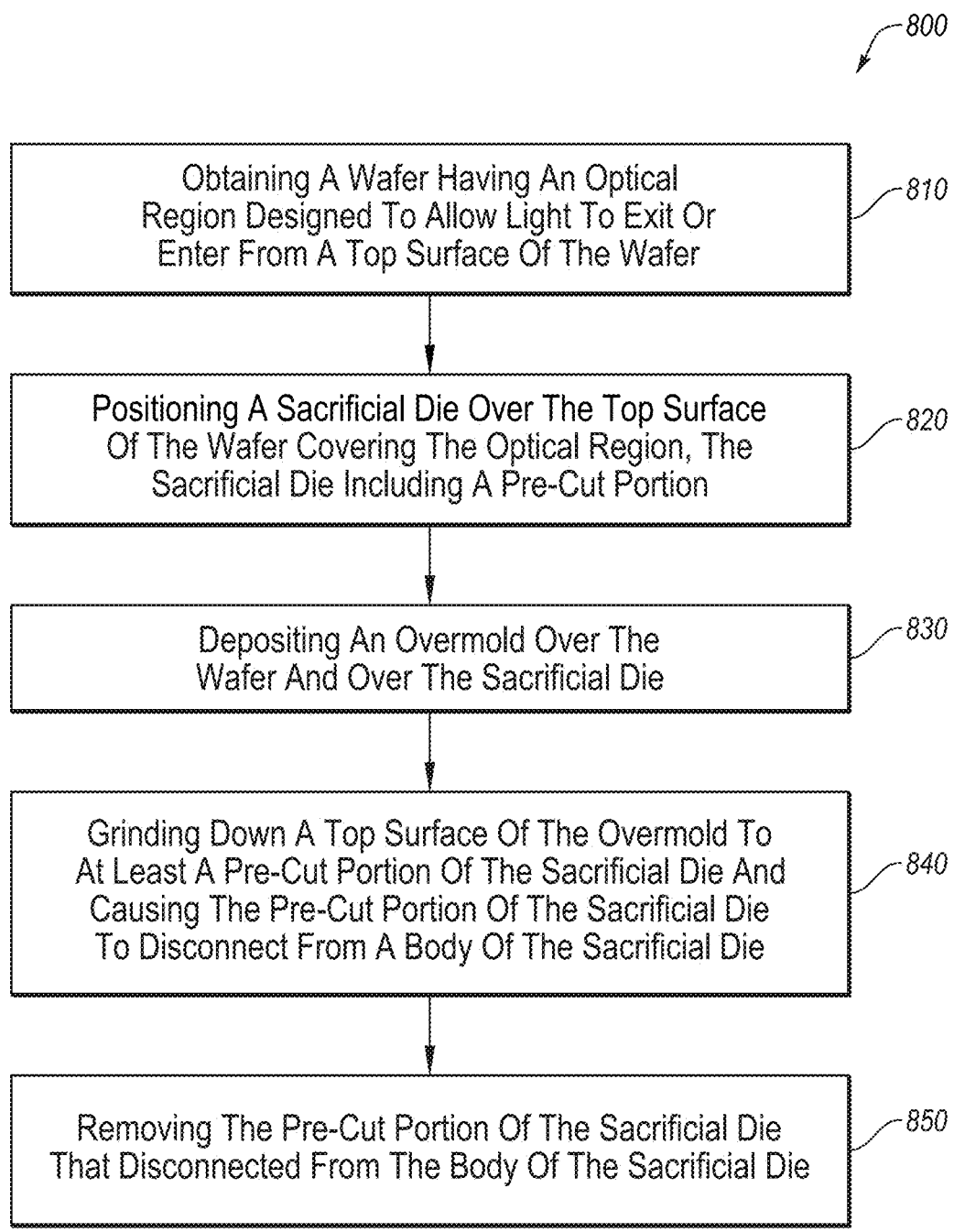
FIGS. 8A-8B illustrates flow diagrams for example series of acts for packaging electro-photonic circuits as described herein, according to at least one embodiment of the present disclosure.
Figure 8B:
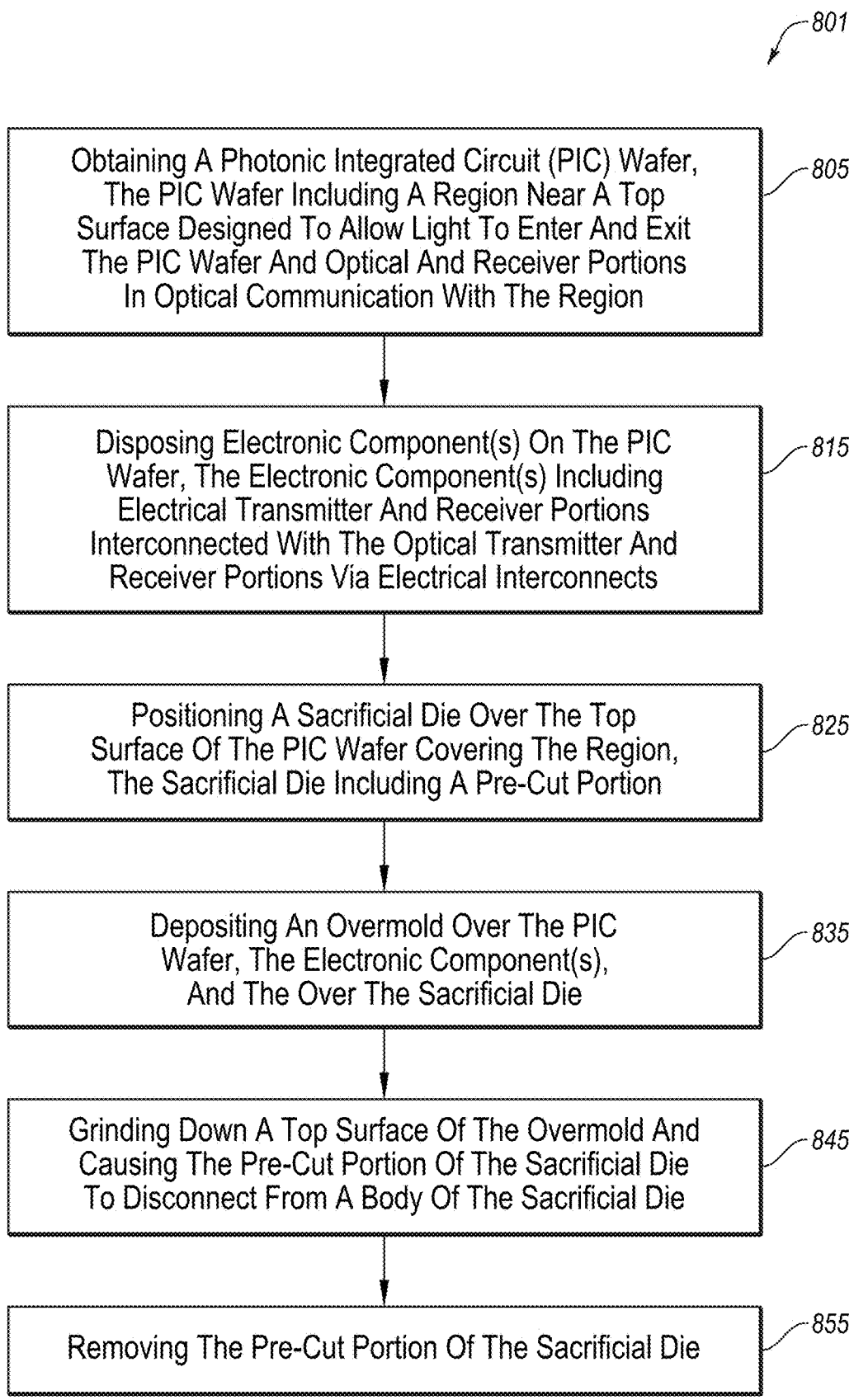

FIGS. 8A-8B illustrate flow diagrams for example methods or series of acts for packaging an electro-photonic circuit in accordance with various embodiments described herein. While FIGS. 8A-8B illustrates acts according to illustrated examples, alternative embodiments may add to, omit, reorder, or modify any of the acts of FIG. 8A-8B.

As just mentioned, FIG. 8A illustrates an example series of acts 800 related to packaging an electro-photonic circuit package. As shown in FIG. 8A, the series of acts 800 includes an act 810 of obtaining a wafer having an optical region designed to allow light to exit or enter from a top surface of the wafer. In one or more embodiments, the act 810 includes obtaining a wafer having a region designed to allow light to exit or enter from a top surface of the wafer. As further shown in FIG. 8A, the series of acts 800 further includes an act 820 of positioning a sacrificial die over the top surface of the wafer covering the optical region, the sacrificial die including a pre-cut portion. As further shown, the series of acts 800 further includes an act 830 of depositing an overmold over the wafer and over the sacrificial die.

As further shown in FIG. 8A, the series of acts 800 includes an act 840 of grinding down a top surface of the overmold to at least a pre-cut portion of the sacrificial die and causing the pre-cut portion of the sacrificial die to disconnect from a body of the sacrificial die. In one or more embodiments, the act 840 involves grinding down a top surface of the overmold, wherein grinding down the top surface of the overmold includes grinding down from a top surface of the sacrificial die to at least the pre-cut portion of the sacrificial die and causing the pre-cut portion of the sacrificial die to disconnect from a body of the sacrificial die.

As further shown in FIG. 8A, the series of acts 800 includes an act 850 of removing the pre-cut portion of the sacrificial die that disconnected from the body of the sacrificial die. In one or more embodiments, removing the pre-cut portion of the sacrificial die exposes an optical path to the region near the top surface of the wafer.

In one or more embodiments, the series of acts 800 includes coupling a plurality of optical fibers to the region using an optical interface component. In one or more embodiments, the optical interface component is a fiber array unit (FAU). In one or more embodiments, the FAU and the optical interface couple components of the electro-photonic circuit with one or more additional components off-chip from the electro-photonic circuit.

In one or more embodiments, the series of acts 800 includes an act of, prior to depositing the overmold over the top surface of the wafer, disposing one or more electronic components on the top surface of the wafer. Disposing the plurality of electronic components over the top surface of the wafer may include connecting electrical contacts on the electronic components to bumps on the top surface of the wafer and forming electro-optical paths to and from the plurality of electronic components to the region via waveguides formed within the wafer. In one or more embodiments, the one or more electronic components include one or more of a processor component, a memory component, or an analog mixed signal (AMS) block.

In one or more embodiments, the series of acts 800 includes pre-cutting the sacrificial die by cutting through a portion of the body of the sacrificial die without cutting through the entire body of the sacrificial die. In one or more embodiments, an uncut portion of the body of the sacrificial die is between 25 and 75 microns thick. In one or more embodiments, the body of the sacrificial die prior to grinding down from the top surface of the sacrificial die is less than 1000 microns thick.

In one or more embodiments, the sacrificial die includes a protective layer that, when positioned over the top surface of the wafer at the position corresponding to the region, provides a protective barrier between the pre-cut portion of the sacrificial die and the region. In one or more embodiments, the sacrificial die includes an adhesive layer around a perimeter of a bottom surface of the pre-cut portion of the sacrificial die, wherein the adhesive layer secures the sacrificial die in place over the top surface of the wafer at the position corresponding to the region. In one or more embodiments, the overmold does not flow between the sacrificial die and the wafer. In one or more embodiments, the sacrificial die is an electrically non-functional component.

FIG. 8B illustrates another example series of acts 801 related to packaging an electro-photonic circuit package. As shown in FIG. 8B, the series of acts 801 includes an act 805 of obtaining a photonic integrated circuit (PIC) wafer, the PIC wafer including a region near a top surface designed to allow light to enter and exit the PIC wafer and optical and receiver portions in optical communication with the region. In one or more embodiments, the act 805 includes obtaining a PIC wafer including a region near a top surface of the PIC wafer designed to allow light to enter and exit the PIC wafer and optical transmitter and receiver portions in optical communication with the region, the optical transmitter and receiver portions having electrical interconnects to the top surface of the PIC wafer in a portion that does not extend into the region.

As further shown in FIG. 8B, the series of acts 801 includes an act 815 of disposing electronic component(s) on the PIC wafer, the electronic component(s) including electrical transmitter and receiver portions interconnected with the optical transmitter and receiver portions via electrical interconnects. In one or more embodiments, act 815 includes disposing one or more electronic components on the PIC wafer, the one or more electronic components including electrical transmitter and receiver portions interconnected with the optical transmitter and receiver portions and forming electro-optical paths to and from the one or more electronic components to the region.

As further shown in FIG. 8B, the series of acts 801 includes an act 825 of positioning a sacrificial die over the top surface of the PIC wafer covering the region, the sacrificial die including a pre-cut portion. In one or more embodiments, act 825 involves positioning a sacrificial die over the top surface of the PIC wafer covering the region, wherein the sacrificial die comprises a pre-cut portion.

As further shown in FIG. 8B, the series of acts 801 includes an act 835 of an overmold over the PIC wafer, the electronic component(s), and the over the sacrificial die. In one or more embodiments, the act 835 includes depositing an overmold over the PIC wafer, the one or more electronic components, and over the sacrificial die.

As further shown in FIG. 8B, the series of acts 801 includes an act 845 of grinding down a top surface of the overmold and causing the pre-cut portion of the sacrificial die to disconnect from a body of the sacrificial die. In one or more embodiments, the act 845 includes grinding down a top surface of the overmold, wherein grinding down the top surface of the overmold includes grinding down from a top surface of the sacrificial die to at least the pre-cut portion of the sacrificial die and causing the pre-cut portion of the sacrificial die to disconnect from a body of the sacrificial die.

As further shown in FIG. 8B, the series of acts 801 includes an act 855 of removing the pre-cut portion of the sacrificial die. In one or more embodiments, the act 855 includes removing the pre-cut portion of the sacrificial die that disconnected from the body of the sacrificial die. In one or more embodiments, removing the pre-cut portion of the sacrificial die exposes an optical path to the region near the top surface of the PIC wafer.

In one or more embodiments, the series of acts 801 includes coupling an optical fiber to a grating coupler in the region using an optical interface component. In one or more embodiments, the optical interface component is a fiber array unit (FAU). In one or more embodiments, the FAU optically couples components of the electro-photonic circuit with one or more additional components off-chip from the electro-photonic circuit via waveguides formed in the PIC wafer.

In one or more embodiments, the series of acts 801 includes pre-cutting the sacrificial die by cutting through a portion of the body of the sacrificial die without cutting through the entire body of the sacrificial die. In one or more embodiments, an uncut portion of the body of the sacrificial die is between 25 and 75 microns thick. In one or more embodiments, the body of the sacrificial die prior to grinding down from the top surface of the sacrificial die is less than 1000 microns thick.

In one or more embodiments, the sacrificial die includes a protective layer that, when positioned over the top surface of the wafer at the position corresponding to the grating coupler region, provides a protective barrier between the pre-cut portion of the sacrificial die and the grating coupler region. In one or more embodiments, the sacrificial die includes an adhesive layer around a perimeter of a bottom surface of the pre-cut portion of the sacrificial die, wherein the adhesive layer secures the sacrificial die in place over the top surface of the PIC wafer at the position corresponding to the grating coupler region.

In one or more embodiments, the overmold does not flow between the sacrificial die and the PIC wafer. In one or more embodiments, the sacrificial die is an electrically non-functional component.

Additional details are now provided regarding circuit packages, including electro-photonic circuit packages. In particular, FIGS. 9A-9B, FIG. 10, and FIG. 11A-11C provide additional details regarding wafers, circuit packages, bidirectional photonic paths, and optical connections via an FAU.

As used herein, the term "photonic" refers to the use of light and/or photons for various applications. For instance, a "photonic path," "photonic channel," "photonic element," "photonic signal," and other similar uses operate based on the transmission of electromagnetic radiation as photons. For instance, in some cases photonic refers to the transmission, manipulation, and/or use of light, such as light in the visible spectrum, or from about 400 to about 700 nm. In some cases, photonic refers specifically to laser light. For example, in some cases photonic may include light or electromagnetic radiation in one or more of the ultraviolet spectrum (100 to 400 nm), the visible light spectrum (400 to 700 nm), or the infrared spectrum (700 nm to 1 mm). For example, in some cases herein, photons may be transmitted via a laser light source operating in any of these (or a smaller range) of wavelengths. In some cases, the term "optical" is used interchangeably herein to mean photonic.

Accordingly, a photonic path or photonic channel refers to the trajectory that photons (e.g., particles of light) follow through a medium or a device designed to guide or manipulate light. A photonic path can include waveguides, fibers, free space transmission paths, and other elements that provide precise control over photon behavior. In some instances, a photonic path includes a photonic elements which route light through a medium. In various implementations, a photonic path corresponds to both macroscopic (classical optics) and microscopic (quantum optics) manipulations of photons.

Figure 9A:
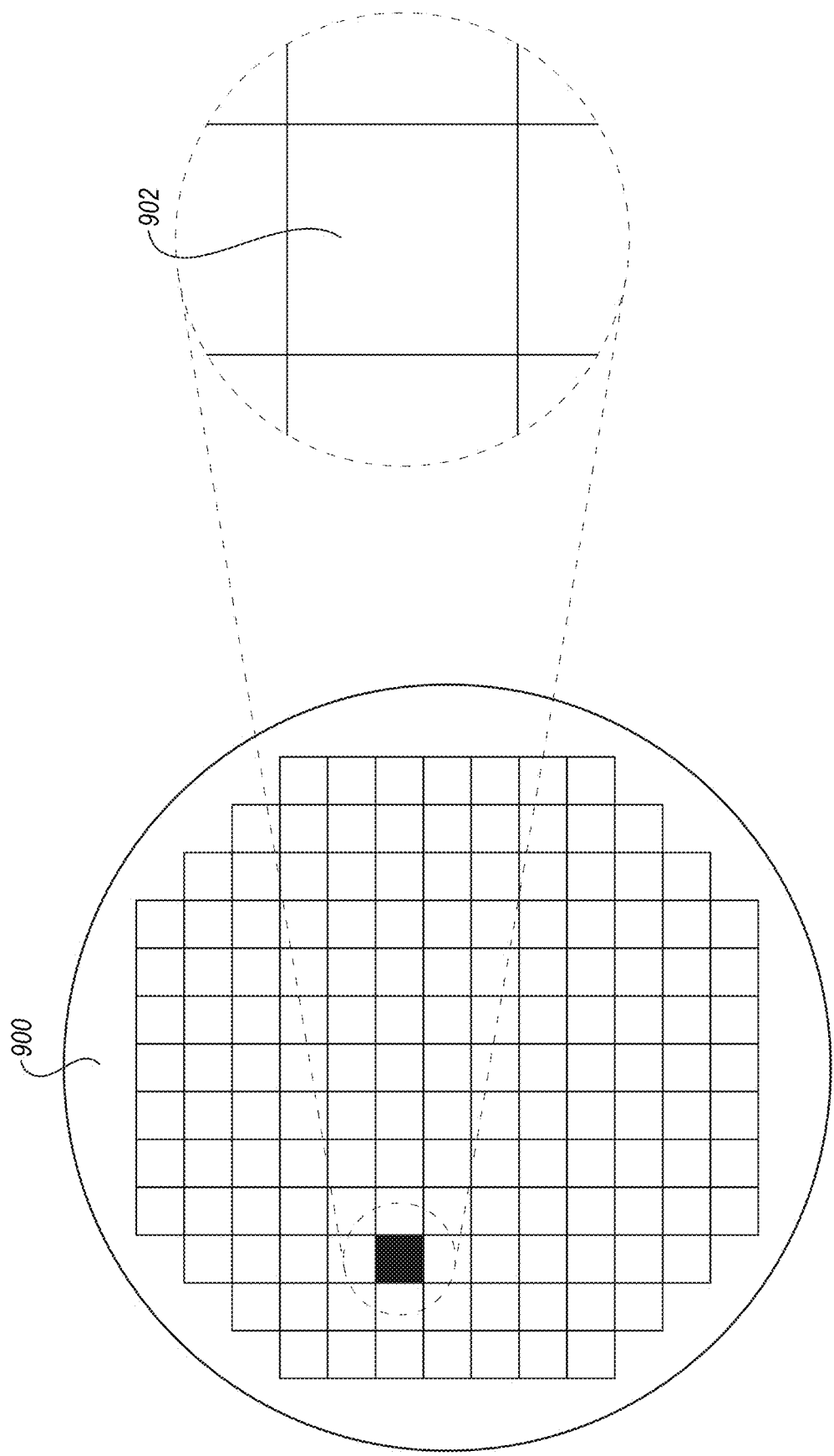
FIG. 9A illustrates a top view of a wafer and a dies, which may be included in one or more circuit packages, according to at least one embodiment of the present disclosure.

In various implementations, various components of a circuit package may be created using wafers. For example, FIG. 9A corresponds to using wafers to create circuit package components according to some implementations. To illustrate, FIG. 9A shows a top view of a wafer 900 and a die 902, which may be included in one or more circuit packages (e.g., microelectronic packages).

In some instances, the wafer 900 is composed of semiconductor material and includes one or more dies having integrated circuit (IC) structures formed on the surface of the wafer 900. As shown, the wafer 900 may comprise multiple (and often many) dies, which may be copies or iterations of the same IC, or may be ICs of different variations. Each of the dies may be a unit of a semiconductor product or other hardware that includes a suitable IC. After the fabrication of the semiconductor product is complete, the wafer 900 may undergo a singulation process in which the dies are separated from one another to provide discrete "chips" of the semiconductor product. The die 902, and at least one other die, may be included in a microelectronic package with a PIC. Accordingly, a die as used herein may refer to a section or portion of a larger wafer structure having an IC formed thereon or may refer to that section or portion having been diced or cut from the wafer as a discrete chip.

A PIC can be formed in a second process using a second wafer (not shown) in a manner analogous to the fabrication of the die 902. While the die 902 may be used to fabricate electronic elements, such as EIC components, a PIC may be fabricated with optical components. In some implementations, the PIC can be embedded into a package substrate. The package substrate may be considered a cored or coreless substrate and may include one or more layers of dielectric material, which may be organic or inorganic.

The package substrate may further include one or more conductive elements, such as vias, pads, traces, microstrips, strip lines, etc. The conductive elements may be internal to, or on the surface of, the package substrate. Generally, the conductive elements may allow for the routing of signals through the package substrate or between elements coupled to the package substrate. In some implementations, the package substrate may be a printed circuit board (PCB), an interposer (e.g., an organic interposer), a motherboard, or other types of substrate.

In one or more implementations, the wafer 900 or the die 902 may include a memory device, a computing device, a storage device, or a combination thereof (examples include, but are not limited to, a random-access memory (RAM) device (such as a static RAM (SRAM) device, a magnetic RAM (MRAM) device, a resistive RAM (RRAM) device, or a conductive-bridging RAM (CBRAM) device), a logic device (e.g., an AND, OR, NAND, NOR, or EXOR gate), a NANO flash memory, a solid-state drive (SSD) memory, a NOR flash memory, a CMOS memory, a thin-film transistor-based memory, a phase-change memory (PCM), a storage class memory (SCM), a magneto-resistive memory (MRAM), a resistive RAM, a DRAM, a high bandwidth memory (HBM), a DOR-based DRAM, a DIMM memory, a CPU, a GPU, an MPU, a tensor engine, a load/store unit (LDSU), a neural compute engine, a dot-product and/or convolution engine, a field-programmable gate array (FPGA), an artificial intelligence (AI) accelerator, or any other suitable circuit element.

Multiple instances of these devices may be combined on a single die. For example, the die 902 may include a memory comprising multiple memory arrays, one or more processors, other logic, communication circuits, and power management functions. The die may operate to execute instructions stored in the memory array or otherwise interact with the memory array using the processors on die 902.

As an additional example of using wafers, FIG. 9B corresponds to components formed on wafers, including one or more circuit packages according to some implementations. To illustrate, FIG. 9B shows a top view of a wafer 910 having various components disposed thereon. For example, one or more circuit packages 912 (e.g., electro-photonic circuit packages) may be formed from various electronic components disposed on a corresponding portion of the wafer 910.

In some cases, the wafer 910 may be composed of a substrate material such as silicon or another substrate material. The substrate may include one or more layers of a dielectric material, which may be organic or inorganic. The wafer 910 may be a PIC wafer having photonic components and/or an EIC wafer having electronic components. In various implementations, the wafer 910 provides various photonic interfaces, channels, photonic components, and other photonic features which, in connection with corresponding electronic components, may form one or more circuit packages 912.

Similar to the above description, the wafer 910 may further include one or more conductive elements, such as vertical interconnect accesses (vias), pads, traces, microstrips, strip lines, etc. The conductive elements may be internal to, or on the surface of, the wafer 910. Generally, the conductive elements may allow for the routing of signals (e.g., power and/or communication signals) through the wafer 910 or between elements coupled to the wafer 910. In some implementations, the wafer 910 may be a PCB, PIC substrate, an interposer (e.g., organic interposer), a motherboard, or another type of substrate.

As mentioned, the one or more circuit packages 912, including electro-photonic circuit packages, may be formed from various electronic components disposed on the wafer 910. In some cases, the electronic components are coupled to photonic components in the wafer 910. In various implementations, the one or more circuit packages 912 include a memory device, a computing device, a storage device, or a combination thereof.

Multiple instances of these examples may be combined in a circuit package. For example, a circuit package may include a memory comprising multiple memory arrays, one or more processors, other logic, communication circuits, and power management functions. Furthermore, the circuit package may execute instructions stored in the memory array or otherwise interact with the memory array using the processors on the one or more circuit packages 912.

In some cases, a single wafer may be advantageously manufactured and utilized for producing several circuit packages. For example, after the fabrication and/or assembly of the circuit packages is complete, the wafer 910 may undergo a singulation (e.g., dicing) process in which individual circuit packages are separated from one another to provide discrete "chips," as mentioned above. An electro-photonic circuit package may include any of the features and/or functionalities according to any of the circuit packages described in this document.

In some cases, each of the one or more circuit packages 912 of the wafer 910 is the same. In various implementations, one or more of the one or more circuit packages 912 (e.g., electro-photonic circuit packages) are configured differently.

In one or more implementations, the wafer 910 may be implemented in connection with various processing equipment by positioning, supporting, and/or securing the wafer 910 with respect to the processing equipment. In some cases, the processing equipment may manipulate, process, or otherwise operate on the wafer 910 as part of forming the one or more circuit packages 912, such as to form one or more TSVs at least partially through the wafer 910, to dispose, position, and/or bond dies to the wafer 910, to form overmolding on the wafer 910, or other processes.

Figure 10:
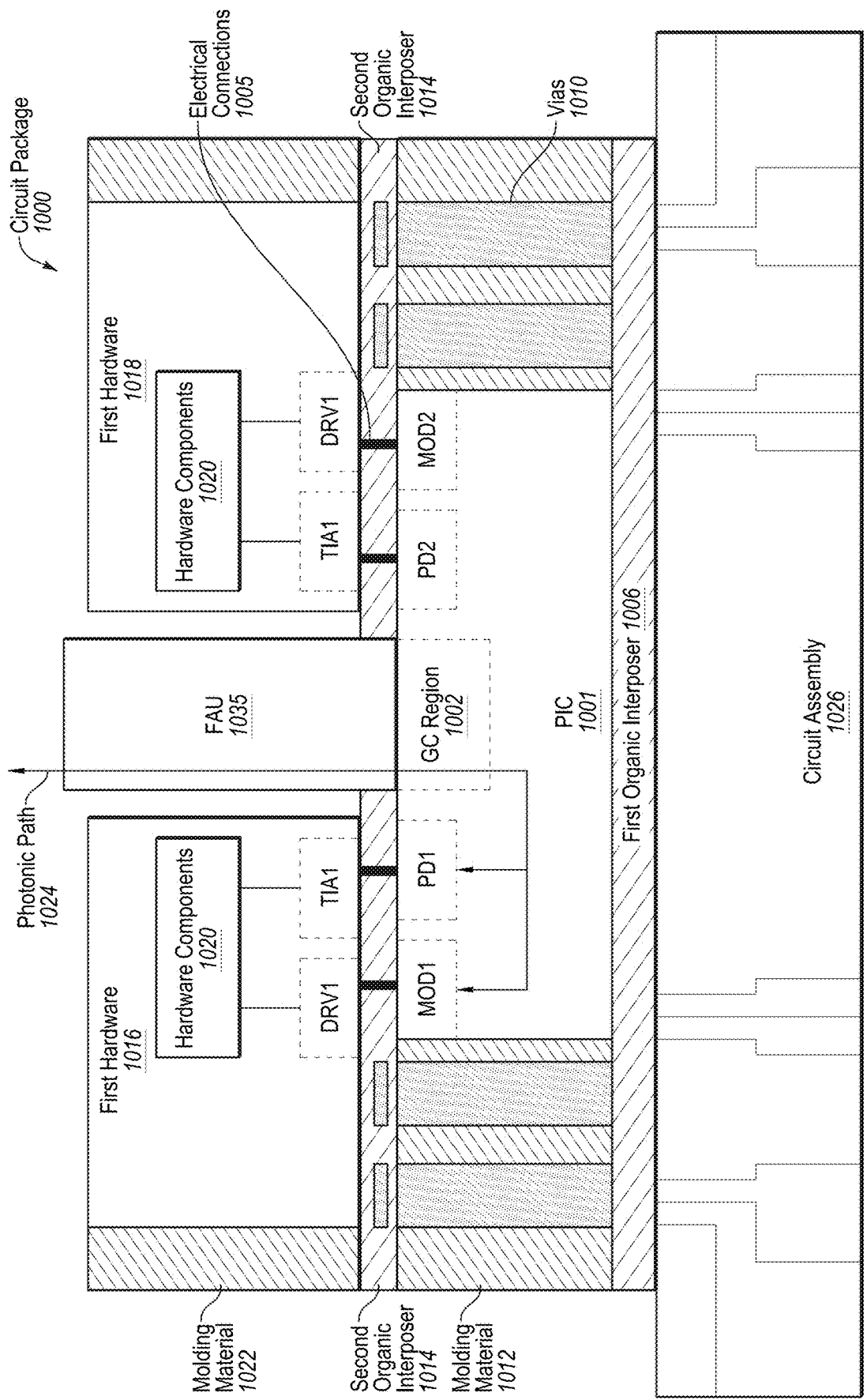
FIG. 10 illustrates an example circuit package having various photonic integrated circuit (PIC) components and EIC components, according to at least one embodiment of the present disclosure.

As mentioned above, circuit packages can include various components and connections. To illustrate, FIG. 10 shows an example side-view cross-section diagram of a circuit package that includes various components and that is coupled to a fiber array unit. In particular, FIG. 10 illustrates an example circuit package having various PIC components and EIC components according to some implementations. While FIG. 10 provides one example implementation of a circuit package that may be used in connection with a PIC and other circuit packages described in this document, FIG. 10 is not intended to limit all circuit packages.

As shown, FIG. 10 includes a circuit package 1000 with a PIC 1001, a first hardware 1016 (e.g., a first die), and a second hardware 1018 (e.g., a second die), each having one or more hardware components 1020 and/or hardware elements. As shown, the PIC 1001 includes a GC region 1002 that allows photonic (e.g., optical or light) signals to enter and exit the PIC 1001. In many implementations, the GC region 1002 is coupled to an FAU 1035, which sits between an internal cavity area within a second organic interposer 1014.

As shown in FIG. 10, the PIC 1001 is positioned over a first organic interposer 1006. The first organic interposer 1006 may be a redistribution layer (RDL) that provides any number of connection structures (e.g., interconnects or connection elements) through which components of the circuit package 1000 and a circuit assembly 1026 (e.g., a substrate) may communicate. For example, in some instances, the circuit assembly 1026 is coupled to electrical or electro-photonic components that enable electrical communications to pass between the circuit package 1000 and other components that are electrically coupled to the circuit assembly 1026.

The first organic interposer 1006 (and organic interposer layers such as the second organic interposer 1014) may refer to a layer having a variety of thicknesses and which includes one or more input/output (I/O) pads (electrical connection elements) that provide connectivity for electrical elements of the circuit package to communicate electronically with other elements of the circuit package. The organic interposer layers (e.g., the first organic interposer 1006 and the second organic interposer 1014) may include wiring, interconnects, and other components that enable components of the circuit package 1000 to be electrically coupled to components of one or more additional electronic packages.

In various implementations, the circuit package 1000 provides optically accessible co-packaged optics to connect one or more external packages to the PIC 1001. Indeed, the GC region 1002 couples to the FAU 1035 (or another optical interface) such that some or all of a bidirectional photonic path within the circuit package 1000 photonically communicates with a light engine or another external device. In turn, the bidirectional photonic path allows these external components to communicate with the hardware components (e.g., the first hardware 1016 and the second hardware 1018) of the circuit package 1000 via a photonic path 1024.

The circuit package 1000 also includes vias 1010 (e.g., conductive through vias such as through-silicon vias (TSVs), through-chip vias, or through-substrate vias). The vias 1010 may be manufactured in any known way so electrical signals (such as power and control signals) can travel between the organic interposers. The vias 1010 provide interconnectivity between different layers of an electrical system within the circuit package 1000. In addition, it will be understood that while FIG. 10 illustrates four of the vias 1010, the circuit package 1000 may include any number of the vias 1010 in various configurations. Further, while FIG. 10 illustrates a side view showing a single row of vias 1010, additional vias may be manufactured toward additional axes (e.g., y-axis, z-axis) relative to the side view shown.

In some implementations, the vias 1010 are formed by etching, removing, or otherwise forming a channel void, conduit, or passage, then depositing one or more conductive layers in the channel. In some cases, the vias may pass entirely from a top surface to the bottom surface of a substrate or material (e.g., an organic interposer). In some cases, the vias may connect to one or more conductive layers, such as to one or more organic interposers. In this way, the vias 1010 may facilitate connecting one or more components positioned on opposite surfaces of an organic interposer, such as connecting EIC components in a hardware or die to corresponding components in a PIC opposite the organic interposer. Additionally, vias may facilitate providing power transmission to various hardware components of the electrical dies by transmitting the power from or through the bottom surface of the circuit package 1000.

As further shown in FIG. 10, the circuit package 1000 includes molding materials 1012, 1022 deposited as part of the process of manufacturing the circuit package 1000. The molding materials 1012, 1022 may be made from a variety of materials having various properties. For example, in one or more implementations, the molding materials 1012, 1022 are epoxy molding compounds in a liquid form that secure elements of the circuit package 1000 in place and cover certain elements contained within the structure of the circuit package 1000.

As shown in FIG. 10, the circuit package 1000 includes a second organic interposer 1014. As mentioned above, the second organic interposer 1014 may be an RDL that provides any number of connection structures (e.g., interconnects) through which components of the circuit package 1000 may communicate. For example, the second organic interposer 1014 includes connective elements and/or interconnects between the vias 1010 and the hardware components (e.g., the first hardware 1016 and the second hardware 1018) within the electronic portion (e.g., the electrical layer) of the circuit package 1000. The second organic interposer 1014 also includes electrical connections 1005 (e.g., electrical interconnects or interconnections, such as copper pillars or wires) between the hardware components and the photonic components (e.g., MOD1, MOD2, PD1, and PD2) in the PIC 1001.

As further shown in FIG. 10, the circuit package 1000 includes connected hardware components (e.g., dies having EIC components) attached above the second organic interposer 1014. In some implementations, the hardware components may include analog-mixed signal (AMS) blocks with components for facilitating the transmission of signals between an electronic domain and a photonic domain. For instance, the AMS blocks include photonic modulator drivers (DRV1, DRV2) for controlling associated photonic modulators (MOD1, MOD2). The modulators (MOD1, MOD2) receive photonic carrier signals and encode data into the carrier signals to transmit, via waveguides (e.g., a portion of the photonic path 1024 located on the PIC 1001), encoded or modulated photonic signals.

In various implementations, the AMS blocks also include transimpedance amplifiers (TIA1, TIA2) for receiving, through a connection to associated photo detectors (PD1, PD2), encoded photonic signals via one or more waveguides. In various implementations, the AMS blocks communicate with electrical hardware blocks (e.g., hardware components), which may refer to a variety of hardware blocks or dies, including EIC die(s) and/or application-specific integrated circuit (ASIC) die(s) having one or more of the components described in this document.

In one or more embodiments described herein, electrical components within the AMS blocks and connected optical components within the PIC 1001 are included within respective portions of transceivers within the circuit package. For instance, in one or more embodiments described herein, an optical transmitter portion of a transceiver may include a modulator, and an electrical transmitter portion of the transceiver may include a driver. The driver may be coupled to the modulator via an interconnect. Further, an optical receiver portion of the transceiver may include a PD, and an electrical receiver portion may include a TIA. The TIA may be coupled to the PD via an interconnect.

As noted above, these respective receiver and/or transmitter portions of the transceiver may be connected via electrical connections (e.g., bumps) and electrical connection elements (e.g., electrical pads or other contacts). For example, an electrical connection element on a surface of the PIC 1001 contacts electrical connection elements on a surface of electrical hardware via an electrical connection to form an electrical connection between the electrical hardware and the PIC 1001. As illustrated and discussed in various embodiments, when connected, these optical and electrical portions may form electro-optical paths to and from electronic components to an optical window (e.g., the GC region 1002), which enables optical signals to be received at and/or transmitted from the electrical components within a circuit package (e.g., circuit package 1000).

The electrical components of the electrical dies, such as the drivers (DRV1, DRV2) and the TIAs (TIA1, TIA2), may be connected to the corresponding photonic components in the PIC 1001, such as MODs (MOD1, MOD2) and PDs (MOD1, MOD2), through electrical connections 1005 (e.g., electrical interconnects). For example, the electrical connections 1005 may be solder bumps, copper pillars, microbumps, or other interconnects for facilitating a connection of components at the surface of a wafer.

The electrical connections 1005 may be printed, deposited, or otherwise positioned on a wafer in accordance with the topography, architecture, or layout of the photonic components in the PIC 1001. For instance, the electrical connections 1005 may be positioned on the surface of a wafer and may form a map or guide for orienting the positioning of the electrical dies (e.g., the first hardware 1016 and the second hardware 1018) on a wafer. In this way, disposing, positioning, bonding, or connecting components of EIC components with each electrical hardware to the wafer may include precisely aligning the EIC components with corresponding electrical connections to form electrical connections.

As mentioned above, in various implementations, the circuit package 1000 is an electro-photonic circuit package that performs one or more computing, memory, or other functionalities and may communicate (e.g., transmit and/or receive) data via photonic signals. Indeed, the circuit package 1000 may facilitate intra-chip electro-photonic communication as well as inter-chip electro-photonic communication.

The circuit package 1000 includes a first hardware 1016 and a second hardware 1018, which may include one or more hardware components 1020. The first hardware 1016 and the second hardware 1018 may have similar or different types of hardware components. For example, the first hardware 1016 includes an ASIC chip that has been programmed, customized, or otherwise configured for a particular use. The first hardware 1016 may additionally or alternatively include other types of hardware components (e.g., electrical hardware components).

The second hardware 1018 may include a similar or different type of hardware components as the first hardware 1016. For example, in one or more implementations, the second hardware 1018 includes high bandwidth memory (HBM) hardware, a CPU, a GPU, a tensor engine, a neural compute engine, or an AI accelerator. Other implementations may include other types of hardware components. In one or more implementations, one or both of the hardware components are electronic hardware components.

While not shown in the illustrated example in FIG. 10, additional components and layers may be manufactured or otherwise added onto the surface of the circuit package 1000. For example, one or more additional distribution layers may be added, and additional circuitry or hardware may be connected having a similar configuration as discussed in connection with any examples discussed herein.

As mentioned, the circuit package 1000 couples with the FAU 1035 or another type of optical interface (O/I), which attaches to the GC region 1002 of the PIC 1001 of the circuit package 1000. The FAU 1035 allows for optical fibers to be connected to the circuit package 1000. Indeed, the interface block allows for an off-chip bidirectional photonic link to be created between the package hardware and external devices. In some implementations, the FAU 1035 couples one or more optical fibers for transmitting photonic signals to and/or from the PIC 1001 via the GC region 1002.

In some implementations, the FAU 1035 and the GC region 1002 may facilitate receiving and transmitting (e.g., encoded) photonic signals between the circuit package 1000 and other (e.g., off-chip) circuit packages. The GC region 1002 of the PIC 1001 may be an optical interface that utilizes a photonic path or photonic connection with the FAU 1035. For example, the FAU 1035 directly mounts or connects to the GC region 1002 such that photonic signals are transmitted directly between GCs in the GC region 1002 and corresponding optical elements in the FAU 1035.

Figure 11A:
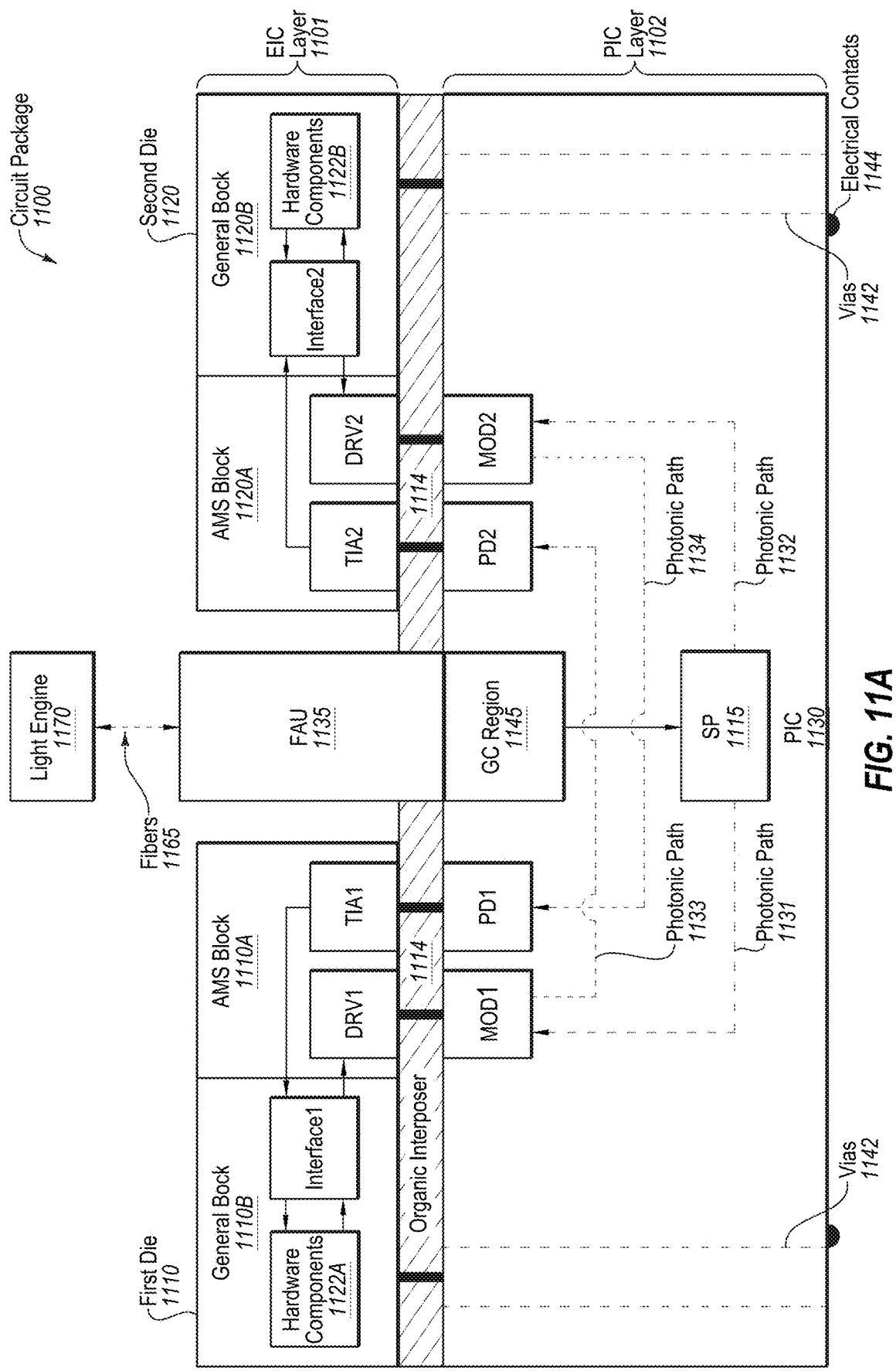
FIGS. 11A-11C illustrate example versions of circuit packages that create a photonic path between a circuit package and one or more circuit packages and/or external devices, according to at least one embodiment of the present disclosure.
Figure 11B:
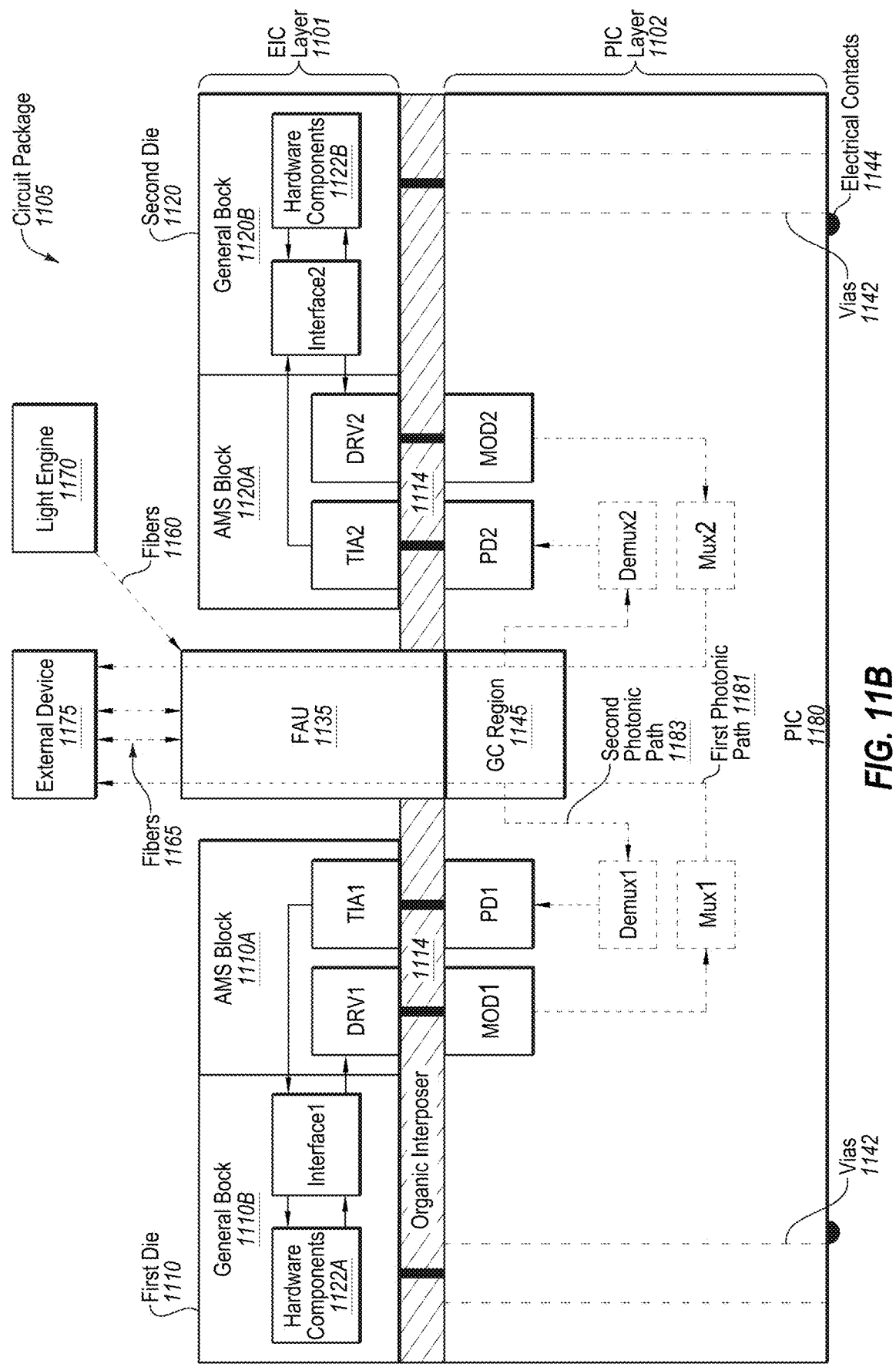
Figure 11C:
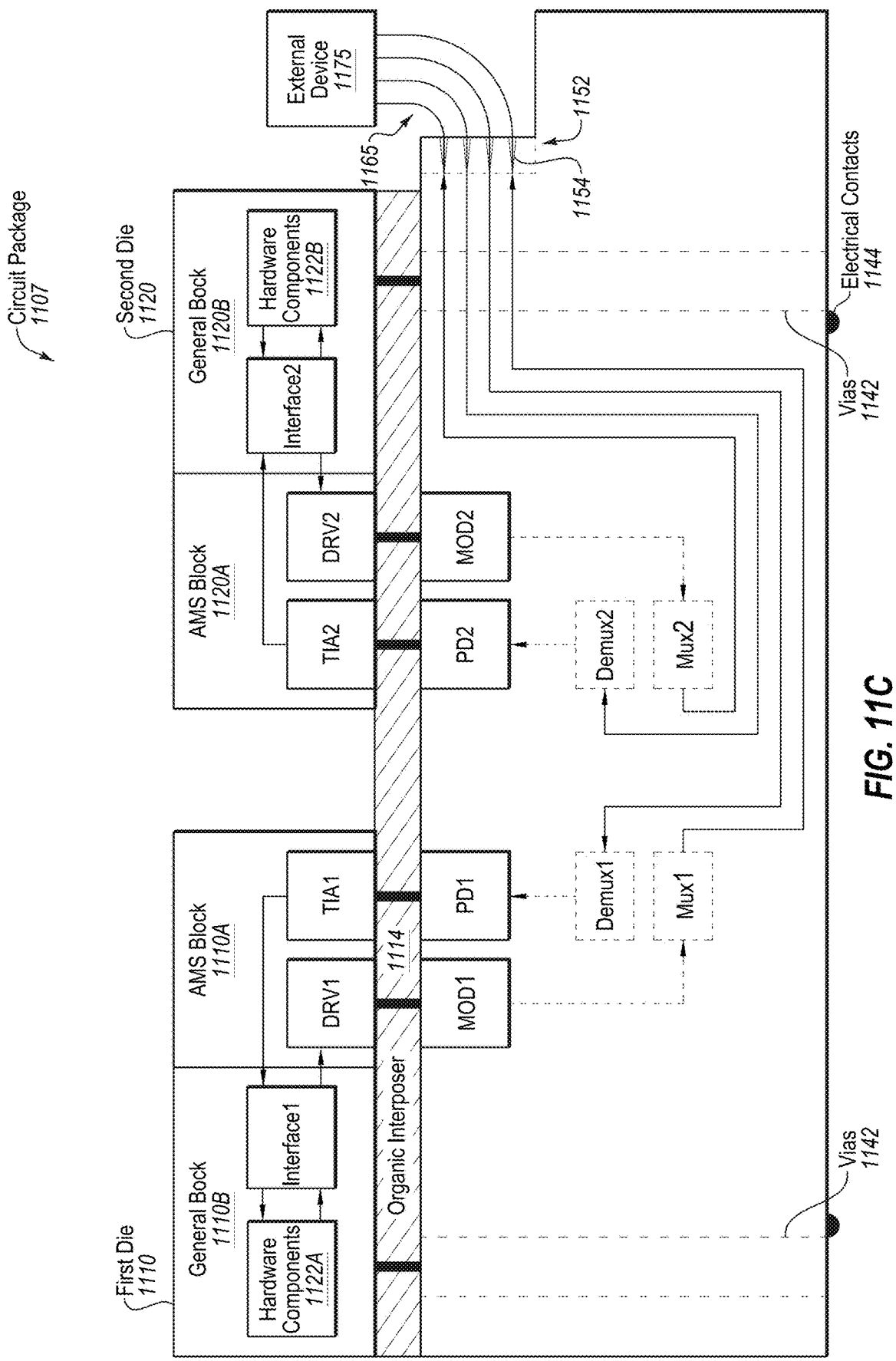

FIGS. 11A-11C illustrate example versions of circuit packages that create a photonic path between a circuit package and one or more circuit packages and/or external devices. Similar to the above description, the packages include a GC region (GC) within a PIC coupled to an FAU (e.g., an optical interface O/I). In some implementations, the PIC includes a GC region on the bottom surface, which enables the FAU or optical interface to couple to the GC region on the bottom of the PIC.

FIG. 11A shows an example package 1100 having an EIC layer 1101 with a first die 1110 and a second die 1120 having intra-chip connections therebetween. The circuit package 1100 also includes a PIC layer 1102 that includes the PIC 1130. To illustrate, FIG. 11A shows photonic paths starting at a light engine 1170 that pass through the FAU 1135 and the GC region 1145 to provide light to a PIC 1130. Additionally, the package 1100 includes a first die 1110, divided into a general block 1110B that may include various processing, storage, and communication functions and/or components (e.g., Interface1 and hardware components 922A), and an AMS block 1110A that includes analog/mixed-signal circuits for interfacing with the PIC 1130. The AMS block 1110A of the first die 1110 may include a driver (DRV1) and a transimpedance amplifier (TIA1). An AMS block 1120A of the second die 1120 may include a driver (DRV2) and a transimpedance amplifier (TIA2). A general block 1120B of the second die 1120 may include various processing, storage, and communication functions and/or components (e.g., Interface2 and hardware components 922B). In some instances, the package includes molding material surrounding the PIC 1130 (e.g., an optical substrate).

As shown in FIG. 11A, the light engine 1170 (e.g., laser light source) transmits light via fibers 1160 to the FAU 1135 and from the FAU 1135 inside the PIC 1130 via the GC region 1145. In some instances, the GC region and the FAU is located on the bottom of the PIC, as described above. Once inside the PIC 1130, the light travels to a splitter 1115 (SP) that distributes the light over two different photonic paths 1131 and 1132 towards modulator MOD1 and modulator MOD2. Example modulator types include a Mach-Zehnder interferometer (MZI), ring resonator, electro-optic modulator (EOM), acousto-optic modulator (AOM), liquid crystal modulator (LCM), and digital micromirror device (DMD).

In one or more implementations, the splitter 1115, or a splitter tree, distributes the light over more than two different photonic paths to additional modulators. A photonic path may be implemented with any suitable optical transmission medium and may include a mixture of waveguides, fibers, and/or free-space optical transmission paths.

Modulator MOD1 modulates the light it receives from the splitter 1115 with information from driver DRV1 and transmits the modulated light to photodetector PD2 via photonic path 1133. Photodetector PD2 converts the received modulated light into an electrical signal for the second die 1120. Together with a serializer (not shown) in the first die 1110, the driver DRV1, transimpedance amplifier TIA2, and a deserializer (not shown) in the second die 1120, modulator MOD1, photonic path 1133, and photodetector PD2 form a data channel, or a unidirectional electro-photonic link, from the first die 1110 to the second die 1120.

Similarly, modulator MOD2 modulates the light it receives from the splitter 1115 with information from driver DRV2 and transmits the modulated light to photodetector PD1 via photonic path 1134. Photodetector PD1 converts the received modulated light into an electrical signal for the first die 1110. Together with a serializer (not shown) in the second die 1120, the driver DRV2, transimpedance amplifier TIA1, and a deserializer (not shown) in the first die 1110, modulator MOD2, photonic path 1134, and photodetector PD1 form a data channel, or a unidirectional electro-photonic link, from the second die 1120 to the first die 1110.

As shown in FIG. 11A, the PIC 1130 (e.g., a photonic IC) includes an organic interposer 1114. The organic interposer 1114 may include a bondpad pattern (e.g., an electrical connection element) located over MOD1 and PD1 that matches a bondpad pattern on the first die 1110 located under DRV1 and TIA1, or is otherwise configured to form an electrical interconnection between the respective components. The organic interposer 1114 may also include a bondpad pattern located over PD2 and MOD2 that matches a bondpad pattern on the second die 1120 located under TIA2 and DRV2, or is otherwise configured to form an electrical interconnection between the respective components.

Two or more bondpads of the bondpad pattern on the first die 1110 are physically and electrically coupled with two or more bondpads of the bondpad pattern in the organic interposer 1114. Similarly, two or more bondpads of the bondpad pattern on the second die 1120 are physically and electrically coupled with two or more bondpads of the bondpad pattern in the organic interposer 1114.

In one or more implementations, the connective elements (e.g., interconnects) in the organic interposer 1114 connect the dies (e.g., the first die 1110 and/or the second die 1120) to the top surface of the PIC 1130. In addition, the interconnects may be implemented using a variety of structures, including copper pillars, solder connections, pads (e.g., bondpads), bump attachments, vias, or any variety of means by which the dies may be coupled to the PIC 1130.

In FIG. 11A, an electrical interconnect is shown making a coupling (or abutted coupling) between elements in the AMS blocks of the dies and the corresponding elements in the PIC 1130. In one or more implementations, the interconnect is a copper pillar no longer than 2 millimeters. In one or more implementations, the copper pillar can be less than 2 millimeters and, in some instances, less than 400 microns. In other implementations, the electrical interconnects can be solder bumps made of materials such as tin, silver, or copper. If solder bumps are used for the interconnects, then the solder bumps may be flip-chip bumps. In other implementations, the interconnects may be elements of a ball-grid array (BGA), pins of a pin grid array (PGA), elements of a land grid array (LGA), or another type of interconnect. In each of these examples, the interconnects can be less than 2 millimeters and, in some cases, range from 1 to 400 microns.

In general, the interconnects have drivers (DRVs) or transimpedance amplifiers (TIAs) at one end and optical modulators (MODs) or photodetectors (PDs) at the other end. For example, in one or more implementations, the interconnects (e.g., vias such as TSVs) may physically couple with, and allow electrical signals to pass between, electrical elements (e.g., pads) of the dies and and/or the PIC 1130. For instance, vias 1142 pass through the PIC 1130 and electrically couple to electrical contacts 1144 at the bottom of the PIC 1130 or the circuit package 1100.

Additionally, in some instances, an electrical interconnect between a driver and a modulator allows the driver to provide an electrical signal that drives the modulator. In another instance, an interconnect between a transimpedance amplifier (TIA) and a photodetector allows the transimpedance amplifier to receive an electrical signal from the photodetector. In some implementations, the interconnects are such that a driver is stacked directly about a corresponding modulator with no lateral displacement between the two components and/or the two components are substantially in the same vertical column. Likewise, in some implementations, a TIA is stacked directly above a corresponding photodetector with no lateral displacement between the two components and/or the two components are substantially in the same vertical column.

The interconnects in the organic interposer may not have a uniform size, shape, or pitch. A finer pitch of interconnects may be desirable to allow a denser communication pathway between elements coupled to the PIC 1130. In one or more implementations, one or more interconnects have minimal lateral displacement. For example, an interconnect is a copper pillar that is straight up and down, perpendicular to the face of a die and the PIC 1130 (e.g., between 1-400 microns in length). This allows the electronic transceiver portions in the AMS block (e.g., DRV and TIA) to be directly stacked at one end of the interconnect above its respective photonic transceiver portion in the PIC (EAM and PD) at the other end of the interconnect. In some implementations, the DRV and TIA, as well as the EAM and PD, can be slightly offset from the copper pillar to reduce parasitic effects while still enabling a sub-400-micron gap (interconnect length) between heat-producing elements in the EIC/AMS and passive elements in the PIC 1130.

FIG. 11B shows an example of a circuit package 1105 that enables an inter-chip or inter-package connection. In particular, FIG. 11B shows a circuit package 1105 (e.g., an electro-photonic circuit package) with a photonic path between the circuit package 1105 and one or more external devices, which may include another circuit package. Similar to the description above, the circuit package 1105 includes the GC region 1145 of the PIC 1180 connected to an FAU 1135. The circuit package 1105 includes an internal cavity area in the organic interposer 1114 that enables the FAU 1135 to couple directly to the GC region 1145. Through the FAU 1135 and the PIC 1180, light signals can enter and exit the circuit package 1105. For example, one or more bidirectional photonic paths through the PIC 1180 allow dies connected to the PIC 1180 to communicate with other external devices.

In FIG. 11B, paths for unmodulated light have been omitted in the PIC 1180. Instead, FIG. 11B shows a first die 1110 and second die 1120 that can photonically communicate with an external device 1175 (e.g., an external device optical interface) via fibers 1165 (e.g., optical fibers), the FAU 1135, and the PIC 1180.

The first die 1110 may transmit data to the external device 1175 via hardware components 922A, Interface1, DRV1, MOD1, and a first photonic path 1181. As shown, the first photonic path 1181 includes an optional multiplexer (MUX1) when wavelength division multiplexing is desired, a first grating coupler in the GC region 1145, the FAU 1135, and/or the fibers 1165. Similarly, the first die 1110 may receive data from the external device 1175 via a second photonic path 1183. The second photonic path 1183 includes the fibers 1165, the FAU 1135, a second grating coupler in the GC region 1145, and/or an optional demultiplexer when wavelength division demultiplexing is desired, PD1, TIA1, and Interface1 (I/F1). The first photonic path 1181 and the second photonic path 1183 (also referred to as unidirectional electro-photonic links) form a bidirectional data path between two devices on different chips.

While one or more of the above examples refer to specific types of dies, interconnects, substrates, grating couplers, and other specific elements associated with transmitting signals via respective components of the example packages, these are illustrative examples and may utilize different types of components. For example, the two (or more) dies may refer to a variety of hardware or dies and not necessarily the pairing of a general die and an AMS die as described in specific implementations herein. Indeed, the two dies may be similar types of hardware and may refer to computing hardware, processing hardware, storage hardware, memory hardware, or other hardware that is implemented on dies and may be coupled to a PIC that optically couples one or more of the dies to an external component in accordance with one or more implementations described herein.

As mentioned above, inter-chip or inter-package connections can include a photonic pathway in both directions (e.g., a bidirectional electro-photonic path), through which data may be communicated between a variety of external components (e.g., another circuit package) that are configured with the external device. In addition, it should be noted that features and functionality of the circuit package may be implemented within a variety of implementations and configurations of packages having different components, setups, and configurations.

FIG. 11C illustrates another example of the circuit package 1107 having inter-chip or inter-package connections via an edge coupler 1152, according to embodiments of the present disclosure. The edge coupler 1152 may be located at an edge of the PIC 1180 and/or PIC layer 103 and may facilitate photonically connecting one or more optical fibers 1165 (e.g., horizontally) at the edge of the PIC 1180 to photonically connect the circuit package 1107 with an external device 1175. For example, the edge coupler 1152 may be positioned at an edge that is formed in the PIC 1180 after the PIC 1180 is diced to separate and/or isolate the circuit package 1107 as a discrete chip from one or more other circuit packages that may be formed on a larger wafer structure.

The edge coupler 1152 may include one or more (typically many) alignment features 1153, such as grooves (e.g., V-grooves), slots, cutouts, or other geometries which may receive and/or align the optical fiber(s) 1165 such that the optical fiber(s) 1165 align with one or more waveguides within the PIC 1180. For instance, these alignment features 1153 may be structures which are designed with a tapered or mode-matching region, to align modes of the optical fibers 1165 and the waveguides at the edge of the PIC 1180 thereby reducing insertion loss and enhancing coupling efficiency therebetween. The waveguides may connect to the various photonic components of the PIC 1130 in any manner described herein (e.g., including any other photonic components of the PIC 1130 as described). In this way, the edge coupler 1152 may provide a photonic interface for the photonic components of the PIC 1130 to transmit and receive off-chip photonic signals, similar to the GC region 1145 as described above.

The edge coupler 1152 may be implemented in the circuit package 1107 as an alternative to the GC region 1145 and FAU 1135, or else may be included in addition to these components. For example, in some implementations the GC 1154 and the edge coupler 1152 are each photonic interfaces which achieve similar objectives of facilitating photonic communication to and/or from the circuit package 1107 with another device, and the circuit package 1107 may be implemented with only one type of these photonic interfaces. For instance, in some cases the GC region 1145 and FAU 1135 may facilitate a vertical or top connection of one or more optical fibers 1165, and the edge coupler 1152 may facilitate a horizontal or side connection of one or more optical fibers 1165. Accordingly, the GC region 1145 or else the edge coupler 1152 may be particularly suited for a specific implementation, space, and/or packaging requirement of the circuit package 1107. In other cases, the circuit package 1107 may be implemented with both the GC region 1145 and the edge coupler 1152, for example, for providing adaptability and connectivity to many different types of devices.

The PIC 1180 and the circuit package 1107 as described above may be exemplary of any of the wafers, circuit packages, wafer packages, or other connections and/or collections of components as described in any of the embodiments herein. For example, various embodiments herein may be described as having a wafer, PIC, PIC wafer, substrate, dies, EIC, etc., and it should be understood that any of these embodiments (e.g., and others described herein) may be implemented having any of the features, components, or configurations as described in FIGS. 9A-11C. For instance, in cases where an electronic component, die, EIC, chip, etc., is described as being connected to, coupled to, positioned on, disposed on, bonded to, etc., in connection with a PIC or PIC wafer (or the like), it should be understood that such components are positioned with respect to photonic components in the PIC wafer and correspondingly connected to the same via electronic interconnects.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method for packaging an electro-photonic circuit, comprising:
    obtaining a substrate having an optical region configured to allow light to exit or enter from a top surface of the substrate;
    positioning a sacrificial die on the top surface of the substrate covering the optical region, wherein the sacrificial die has been pre-cut with a plurality of vertical cuts extending from a bottom surface of the sacrificial die towards a top surface of the sacrificial die, the plurality of vertical cuts defining a portion of the sacrificial die positioned over the optical region;
    depositing an overmold over the substrate and over the sacrificial die;
    grinding down a top surface of the overmold, wherein grinding down the top surface of the overmold includes grinding down from the top surface of the sacrificial die to a vertical position within a body of the sacrificial die where the plurality of vertical cuts extend, thereby causing the portion of the sacrificial die positioned over the optical region to disconnect from the body of the sacrificial die; and
    removing the portion of the sacrificial die that disconnected from the body of the sacrificial die.

2. The method of claim 1, wherein removing the portion of the sacrificial die exposes an optical path to the optical region near the top surface of the substrate.

3. The method of claim 1, further comprising coupling a plurality of optical fibers to the optical region using an optical interface component.

4. The method of claim 3, wherein the optical interface component is a fiber array unit (FAU).

5. The method of claim 1, wherein:
    the substrate comprises bumps on the top surface of the substrate and waveguides formed within the substrate; and
    the method further comprises, prior to depositing the overmold over the top surface of the substrate, disposing one or more electronic components on the top surface of the substrate, wherein disposing the one or more of electronic components over the top surface of the substrate comprises electrically connecting the one or more electronic components to the bumps on the top surface of the substrate to form electro-optical paths from the one or more electronic components to the optical region through the waveguides formed within the substrate.

6. The method of claim 5, wherein the one or more electronic components include one or more of a processor component, a memory component, or an analog mixed signal (AMS) block.

7. The method of claim 1, further comprising pre-cutting the sacrificial die by cutting the plurality of vertical cuts through a portion of the body of the sacrificial die without cutting through an entire body of the sacrificial die.

8. The method of claim 1, wherein an uncut portion of the body of the sacrificial die is between 25 and 75 microns thick.

9. The method of claim 8, wherein the body of the sacrificial die prior to grinding down from the top surface of the sacrificial die is less than 1000 microns thick.

10. The method of claim 1, wherein the sacrificial die includes a protective layer that, when positioned over the top surface of the substrate at the position corresponding to the optical region, provides a protective barrier between a bottom surface of the sacrificial die and the optical region.

11. The method of claim 1, wherein the sacrificial die includes an adhesive layer around a perimeter of the bottom surface of the sacrificial die positioned over the optical region, wherein the adhesive layer secures the sacrificial die in place over the top surface of the substrate at the position corresponding to the optical region.

12. The method of claim 1, wherein positioning the sacrificial die over the top surface of the substrate covering the optical region prevents the overmold from flowing between the sacrificial die and the substrate.

13. The method of claim 1, wherein the sacrificial die is an electrically non-functional component.

14. A method for packaging an electro-photonic circuit, comprising:
    obtaining a photonic integrated circuit (PIC) wafer comprising:
        an optical region near a top surface of the PIC wafer configured to allow light to enter and exit the PIC wafer;
        optical transmitter and receiver portions in optical communication with the optical region, the optical transmitter and receiver portions having electrical interconnects to the top surface of the PIC wafer in a portion that does not extend into the optical region; and
        one or more electronic components on the PIC wafer, the one or more electronic components including electrical transmitter and receiver portions interconnected with the optical transmitter and receiver portions and forming electro-optical paths to and from the one or more electronic components to the optical region;
    positioning a sacrificial die over the top surface of the PIC wafer covering the optical region, wherein the sacrificial die has been pre-cut with a plurality of vertical cuts extending from a bottom surface of the sacrificial die towards a top surface of the sacrificial die, the plurality of vertical cuts defining a portion of the sacrificial die positioned over the optical region;
    depositing an overmold over the PIC wafer, the one or more electronic components, and over the sacrificial die;
    grinding down a top surface of the overmold, wherein grinding down the top surface of the overmold includes grinding down from the top surface of the sacrificial die to a vertical position within a body of the sacrificial die where the plurality of vertical cuts extend, thereby causing the portion of the sacrificial die positioned over the optical region to disconnect from the body of the sacrificial die; and
    removing the portion of the sacrificial die that disconnected from the body of the sacrificial die.

15. The method of claim 14, wherein removing the portion of the sacrificial die exposes an optical path to the optical region near the top surface of the PIC wafer.

16. The method of claim 15, wherein the sacrificial die is an electrically non-functional component.

17. The method of claim 14, further comprising coupling an optical fiber to a grating coupler in the optical region using an optical interface component, the optical interface component comprising a fiber array unit (FAU).

18. The method of claim 14, further comprising pre-cutting the sacrificial die by cutting the plurality of vertical cuts through a portion of the body of the sacrificial die without cutting through an entire body of the sacrificial die.

19. The method of claim 14, wherein an uncut portion of the body of the sacrificial die is between 25 and 75 microns thick.

20. The method of claim 19, wherein the body of the sacrificial die prior to grinding down from the top surface of the sacrificial die is less than 1000 microns thick.

21. The method of claim 14, wherein the sacrificial die includes a protective layer that, when positioned over the top surface of the wafer at the position corresponding to the optical region, provides a protective barrier between the bottom surface of the sacrificial die and the optical region.

22. The method of claim 14, wherein the sacrificial die includes an adhesive layer around a perimeter of the bottom surface of the sacrificial die positioned over the optical region, wherein the adhesive layer secures the sacrificial die in place over the top surface of the PIC wafer at the position corresponding to the optical region.

* * * * *